United States Patent
Xu et al.

(10) Patent No.: US 11,903,211 B2
(45) Date of Patent: Feb. 13, 2024

(54) METHODS OF FORMING A MICROELECTRONIC DEVICE INCLUDING STAIR STEP STRUCTURES

(71) Applicant: Micron Technology, Inc., Boise, ID (US)

(72) Inventors: Lifang Xu, Boise, ID (US); John D. Hopkins, Meridian, ID (US); Roger W. Lindsay, Boise, ID (US); Shuangqiang Luo, Boise, ID (US)

( * ) Notice: Subject to any disclaimer, the term of this patent is extended or adjusted under 35 U.S.C. 154(b) by 0 days.

(21) Appl. No.: 17/647,238

(22) Filed: Jan. 6, 2022

(65) Prior Publication Data

US 2022/0130850 A1    Apr. 28, 2022

Related U.S. Application Data

(63) Continuation of application No. 16/686,830, filed on Nov. 18, 2019, now Pat. No. 11,239,248.

(51) Int. Cl.
| | |
|---|---|
| *H10B 43/40* | (2023.01) |
| *H01L 23/522* | (2006.01) |
| *H01L 23/528* | (2006.01) |
| *H01L 23/535* | (2006.01) |
| *H01L 21/768* | (2006.01) |
| *H10B 41/41* | (2023.01) |

(52) U.S. Cl.
CPC ....... *H10B 43/40* (2023.02); *H01L 21/76805* (2013.01); *H01L 21/76816* (2013.01); *H01L 21/76826* (2013.01); *H01L 21/76877* (2013.01); *H01L 21/76895* (2013.01); *H01L 23/5226* (2013.01); *H01L 23/5283* (2013.01); *H01L 23/535* (2013.01); *H10B 41/41* (2023.02)

(58) Field of Classification Search
CPC ............................ H10B 43/40; H01L 21/76877
See application file for complete search history.

(56) References Cited

U.S. PATENT DOCUMENTS

| | | |
|---|---|---|
| 9,064,576 B2 | 6/2015 | Tanzawa |
| 9,941,209 B2 | 4/2018 | Tessariol et al. |
| 10,141,330 B1 | 11/2018 | Lindsay et al. |
| 10,269,626 B2 | 4/2019 | Ha et al. |
| 10,381,080 B2 | 8/2019 | Pan et al. |
| 2017/0256551 A1* | 9/2017 | Lee ........................ H10B 41/50 |
| 2018/0053686 A1* | 2/2018 | Hyun ...................... H10B 43/50 |
| 2019/0363006 A1* | 11/2019 | Min .................... H01L 21/3105 |
| 2020/0035553 A1 | 1/2020 | Yatsuda et al. |
| 2020/0251490 A1* | 8/2020 | Matsumoto ......... H01L 23/5226 |

\* cited by examiner

*Primary Examiner* — Farun Lu
(74) *Attorney, Agent, or Firm* — TraskBritt

(57) ABSTRACT

A method of forming a microelectronic device comprises forming isolated nitride structures on steps of stair step structures comprising stacked tiers comprising alternating levels of a first insulative material and a second insulative material, forming a photoresist material over some of the stair step structures, and replacing the isolated nitride structures and the second insulative material with an electrically conductive material to respectively form conductive pad structures and electrically conductive lines. Related microelectronic devices and electronic devices are also disclosed.

12 Claims, 20 Drawing Sheets

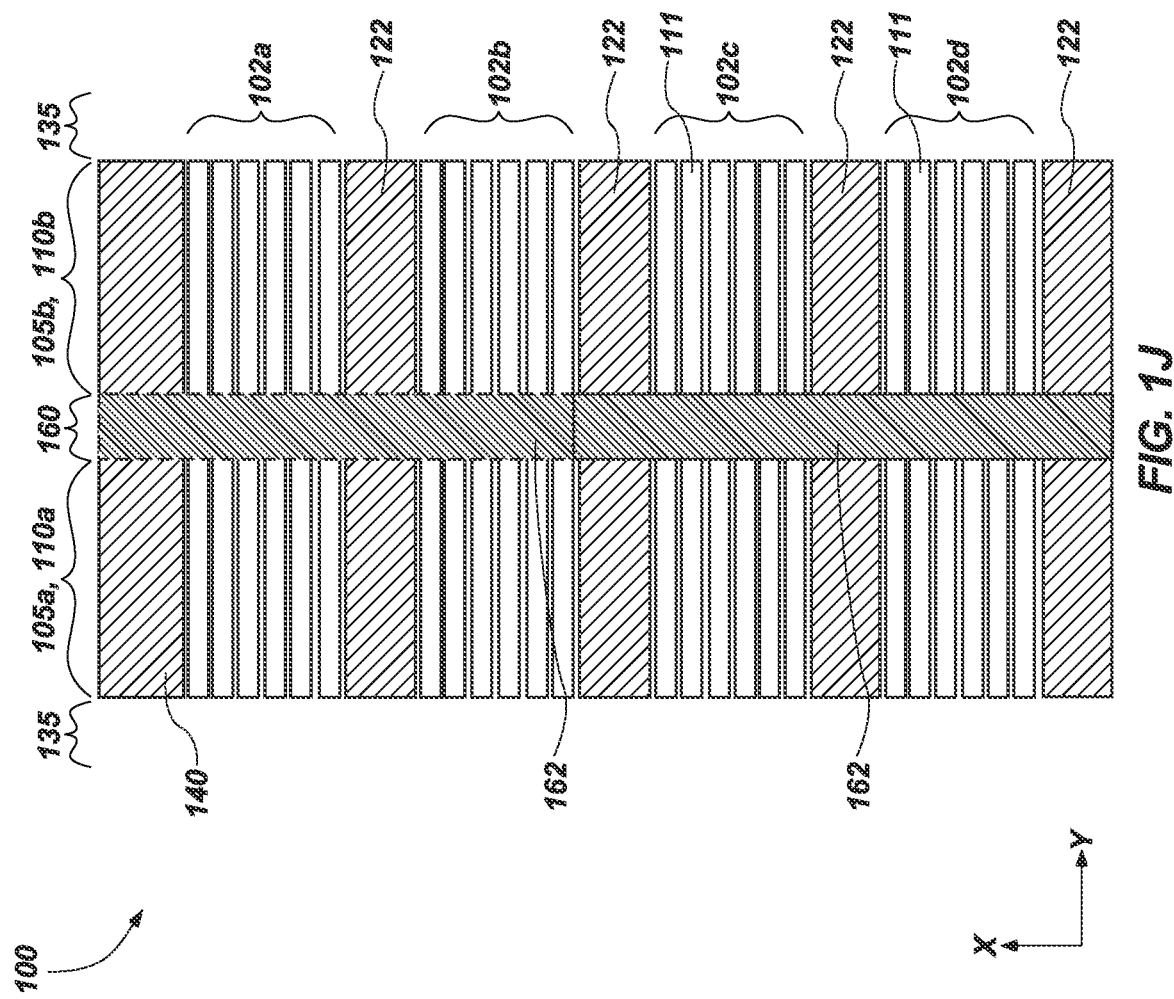

METHODS OF FORMING A MICROELECTRONIC DEVICE INCLUDING STAIR STEP STRUCTURES

CROSS-REFERENCE TO RELATED APPLICATION

This application is a continuation of U.S. patent application Ser. No. 16/686,830, filed Nov. 18, 2019, now U.S. Pat. No. 11,239,248, issued Feb. 1, 2022, the disclosure of which is hereby incorporated herein in its entirety by this reference.

TECHNICAL FIELD

The disclosure, in various embodiments, relates generally to the field of microelectronic device design and fabrication. More specifically, the disclosure relates to microelectronic devices including staircase structures, and to related electronic systems and methods.

BACKGROUND

A continuing goal of the microelectronics industry has been to increase the memory density (e.g., the number of memory cells per memory die) of memory devices, such as non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes vertical memory strings extending through openings in tiers of conductive structures (e.g., word lines) and dielectric materials at each junction of the vertical memory strings and the conductive structures. Such a configuration permits a greater number of switching devices (e.g., transistors) to be located in a unit of die area (i.e., length and width of active surface consumed) by building the array upwards (e.g., longitudinally, vertically) on a die, as compared to structures with conventional planar (e.g., two-dimensional) arrangements of transistors.

Conventional vertical memory arrays include electrical connections between the conductive structures and access lines (e.g., word lines) so that memory cells in the vertical memory array can be uniquely selected for writing, reading, or erasing operations. One method of forming such an electrical connection includes forming so-called at least one "staircase" (or "stair step") structure at edges (e.g., horizontal ends) of the tiers of conductive structures. The staircase structure includes individual "steps" providing contact regions of the conductive structures upon which conductive contact structures can be positioned to provide electrical access to the conductive structures.

As vertical memory array technology has advanced, additional memory density has been provided by forming vertical memory arrays to include additional tiers of conductive structures and, hence, additional staircase structures and/or additional steps in individual staircase structures associated therewith. However, increasing the quantity of tiers of conductive structures (and hence, the quantity of staircase structures and/or the quantity of steps in individual staircase structures) of a stack structure without undesirably increasing the overall width (e.g., lateral footprint) of the stack structure can result in undesirably complex and congested routing paths to electrically connect the conductive structures to additional components (e.g., string drivers) of the memory device. In some instances, as the complexity and congestion of the routing paths increases, the likelihood of different electrically conductive portions undesirably interacting with each other (e.g., shorting to each other) increases. Further, as the height of the staircase structure increases, there is an increased risk of punching through the uppermost steps of the staircase structure when forming electrical contacts to the steps.

BRIEF DESCRIPTION OF THE DRAWINGS

FIG. 1A through FIG. 1K illustrate a method of forming a microelectronic device, in accordance with embodiments of the disclosure;

DETAILED DESCRIPTION

Figure 1A:
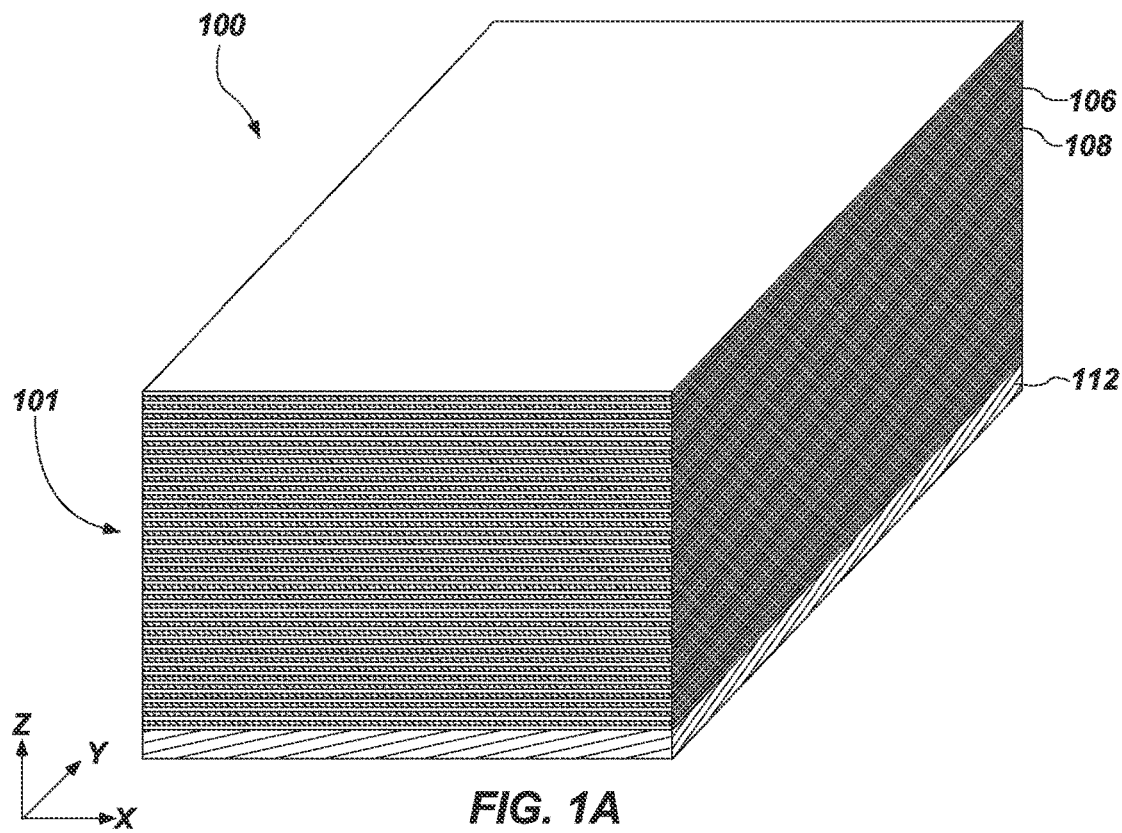

The illustrations included herewith are not meant to be actual views of any particular systems, microelectronic structures, microelectronic devices, or integrated circuits thereof, but are merely idealized representations that are employed to describe embodiments herein. Elements and features common between figures may retain the same numerical designation except that, for ease of following the description, reference numerals begin with the number of the drawing on which the elements are introduced or most fully described.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete process flow for manufacturing a microelectronic device (e.g., a memory device, such as a 3D NAND Flash memory device) or a complete microelectronic device. The structures described below do not form a complete microelectronic device. Only those process acts and structures necessary to understand the embodiments described herein are described in detail below. Additional acts to form a complete microelectronic device from the structures may be performed by conventional techniques.

The materials described herein may be formed by conventional techniques including, but not limited to, spin coating, blanket coating, chemical vapor deposition (CVD), atomic layer deposition (ALD), plasma enhanced ALD, physical vapor deposition (PVD), plasma enhanced chemical vapor deposition (PECVD), or low pressure chemical vapor deposition (LPCVD). Alternatively, the materials may be grown in situ. Depending on the specific material to be formed, the technique for depositing or growing the material may be selected by a person of ordinary skill in the art. The removal of materials may be accomplished by any suitable technique including, but not limited to, etching, abrasive planarization (e.g., chemical-mechanical planarization), or other known methods unless the context indicates otherwise.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by Earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

As used herein, an "electrically conductive material" refers to one or more of a metal, such as tungsten, titanium, niobium, vanadium, hafnium, tantalum, chromium, zirconium, iron, osmium, cobalt, nickel, iridium, platinum, palladium, ruthenium, rhodium, aluminum, copper, molybdenum, gold, a metal alloy, a metal-containing material (e.g., metal nitrides (titanium nitride, tantalum nitride, tungsten nitride, titanium aluminum nitride), metal silicides (tantalum silicides, tungsten silicides, nickel silicides, titanium silicides), metal carbides, metal oxides (iridium oxide, ruthenium oxide)), a conductively-doped semiconductor material (e.g., conductively-doped silicon, conductively-doped germanium, conductively-doped silicon germanium, etc.), polysilicon, other materials exhibiting electrical conductivity, or combinations thereof. Electrically conductive materials may include at least one of titanium nitride (TiN), tantalum nitride (TaN), tungsten nitride (WN), titanium aluminum nitride (TiAlN), elemental titanium (Ti), elemental platinum (Pt), elemental rhodium (Rh), elemental ruthenium (Ru), elemental molybdenum (Mo), elemental iridium (Jr), iridium oxide ($IrO_x$), elemental ruthenium (Ru), ruthenium oxide ($RuO_x$), elemental tungsten (W), aluminum (Al), elemental copper (Cu), elemental gold (Au), elemental silver (Ag), polysilicon, alloys thereof, or combinations thereof. The terms "electrically conductive material" and "conductive material" may be used interchangeably herein.

According to embodiments described herein, a method of forming a microelectronic device including a stair step region including tiers comprising vertically alternating conductive structures and insulative structures is described. The stair step region may include different stair step structures each including steps defining contact regions for conductive structures (e.g., conductive lines, such as access lines (e.g., word lines)) upon which electrically conductive contact structures are positioned to provide electrical access to the conductive structures. In some embodiments, the steps of the different stair step structures are located at different vertical distances from an underlying material (e.g., an underlying source material). Some of the stair step structures (e.g., uppermost stair step structures, stair step structures other than lowermost stair step structures) may be formed with isolated nitride structures to facilitate forming the electrically conductive contact structures in electrical communication with the conductive structures without undesirably punching through the conductive structures of the stair step structures during formation of the electrically conductive contact structures. In some embodiments, the isolated nitride structures are formed on the uppermost stair step regions and not on the lowermost stair step structures (e.g., stair step structures located proximate to an underlying material, such as an underlying source material or an insulative material that will eventually be replaced with a conductive material to form a select gate structure). During formation of the conductive structures, the isolated nitride structures may be replaced with an electrically conductive material to form electrically conductive pad structures, which in turn provide electrical communication between the conductive structures and the electrically conductive contact structure of the particular step after formation of the electrically conductive contact structures. The lowermost stair step structure may not include the conductive pad structures and the steps of the lowermost stair step structure may directly contact their respective electrically conductive contact structures. Since the steps of the lowermost stair step structure do not include the isolated nitride structures or the resulting electrically conductive pad structures, the lowermost stair step structure may not include materials that undesirably interact with (e.g., short to) underlying electrically conductive materials, such as underlying select gate structures. Stated another way, since the steps of the lowermost stair step structure do not include the isolated nitride structures, electrically conductive pad structures are not formed on the lowermost stair step structures and, therefore, do not span between isolated select gate structures (e.g., between select gate structures of adjacent sub-block structures). The isolated nitride structures may reduce (or even prevent) punching through of the conductive structures, such as the uppermost conductive structures, when forming the electrically conductive contact structures.

Accordingly, the microelectronic device may include a stair step region including stair step structures. Lowermost stair step structures may not include electrically conductive pad structures while the uppermost stair step structures include electrically conductive pad structures formed by replacement of the isolated nitride structures with a conductive material. A thickness (e.g., in the vertical direction) of the electrically conductive pad structures may be greater than a thickness of the conductive structure of the respective step in electrical communication with the electrically conductive pad structure. Since the lowermost stair step structures do not include the electrically conductive pad structures which span across isolated select gate structures, the select gate structures located proximate (e.g., below) the lowermost stair step structures are not shorted together by the electrically conductive pad structures. In other words, the lowermost stair step structures may not electrically short to underlying materials since they are formed without the isolated nitride structures or the isolated nitride structures are removed therefrom prior to replacing the isolated nitride structures with conductive materials. In addition, the isolated nitride structures, when replaced with a conductive material, provide additional material thickness to protect the underlying conductive structures of the uppermost stair step structures from being damaged (e.g., punched through) during formation of electrically conductive contact structures to the conductive structures.

FIG. 1A through FIG. 1K illustrate a method of forming a microelectronic device structure 100, in accordance with embodiments of the disclosure. FIG. 1A is a simplified perspective view of a microelectronic device structure 100 comprising a stack structure 101 including a vertically alternating (e.g., in z-direction) sequence of insulative materials 106 and another insulative material 108. For clarity, the insulative materials 106 are illustrated without cross-hatching in FIG. 1A through FIG. 1H.

The insulative material 106 may include, for example, one or more of an oxide material (e.g., silicon dioxide ($SiO_2$), phosphosilicate glass, borosilicate glass, borophosphosilicate glass, fluorosilicate glass, titanium dioxide ($TiO_2$), hafnium oxide ($HfO_2$), zirconium dioxide ($ZrO_2$), hafnium dioxide ($HfO_2$), tantalum oxide ($TaO_2$), magnesium oxide (MgO), aluminum oxide ($AL_2O_3$), or a combination thereof), and amorphous carbon. In some embodiments, the insulative material 106 is formed of and includes silicon dioxide.

The other insulative material 108 may include an insulative material exhibiting an etch selectivity with respect to the insulative material 106. The other insulative material 108 may include, for example, a nitride material (e.g., silicon nitride ($Si_3N_4$)), an oxynitride material (e.g., silicon oxynitride). In some embodiments, the other insulative material 108 comprises a nitride material, such as silicon nitride.

A lowermost one of the insulative materials 106 may be located adjacent a source structure 112 (e.g., a common source plate (CSP)). As will be described herein, during fabrication of the microelectronic device structure 100, a portion of the lowermost other insulative material 108 may be replaced to form conductive structures, such as select gate structures 110 (FIG. 1I, FIG. 1J), which may comprise a select gate source (SGS) structure.

Figure 1B:
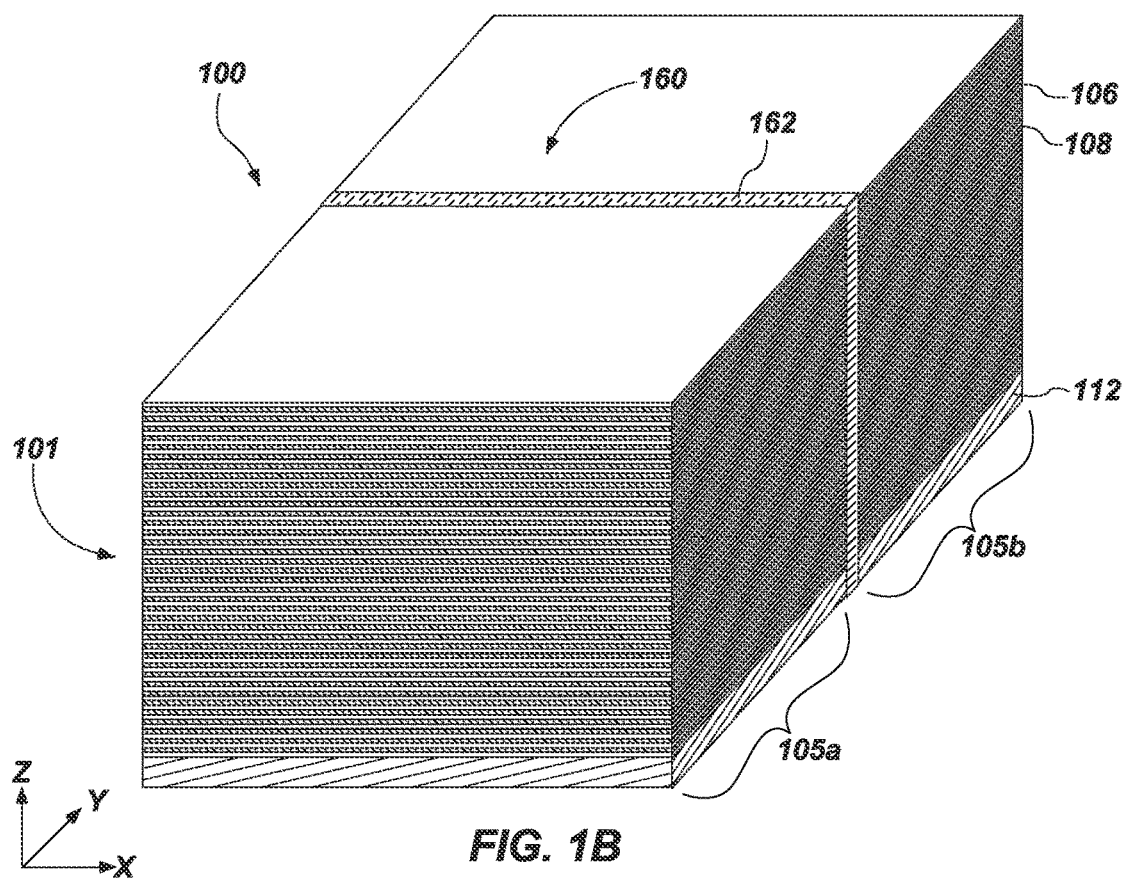

Referring to FIG. 1B, one or more slots 160 (only one illustrated in FIG. 1B) may be formed through the stack structure 101 and through the underlying source structure 112. The slots 160 may extend in the x-direction. The slots 160 may be filled with a dielectric material 162 comprising an electrically insulative material. The dielectric material 162 may comprise, for example, phosphosilicate glass, borosilicate glass, borophosphosilicate glass (BPSG), fluorosilicate glass, silicon dioxide, titanium dioxide, a nitride material, (e.g., silicon nitride ($Si_3N_4$)), an oxynitride (e.g., silicon oxynitride), another dielectric material, a dielectric carbon nitride material (e.g., silicon carbon nitride (SiCN)), a dielectric carboxynitride material (e.g., silicon carboxynitride (SiOCN)), or combinations thereof. In some embodiments, the dielectric material 162 comprises silicon dioxide.

The slot 160 may separate the stack structure 101 into a first sub-block 105a and a second sub-block 105b. As will be described herein, when a lowermost other insulative material 108 is replaced with an electrically conductive material, the slot 160 may electrically isolate the electrically conductive material in the first sub-block 105a from the electrically conductive material in the second sub-block 105b and form a first select gate structure 110a (FIG. 1J) electrically isolated from a second select gate structure 110b (FIG. 1J). In other words, the slot 160 may be used to separate a lowermost other insulative material 108 into two portions that, when replaced with a conductive material, forms isolated select gate structures 110 (FIG. 1J).

Figure 1C:
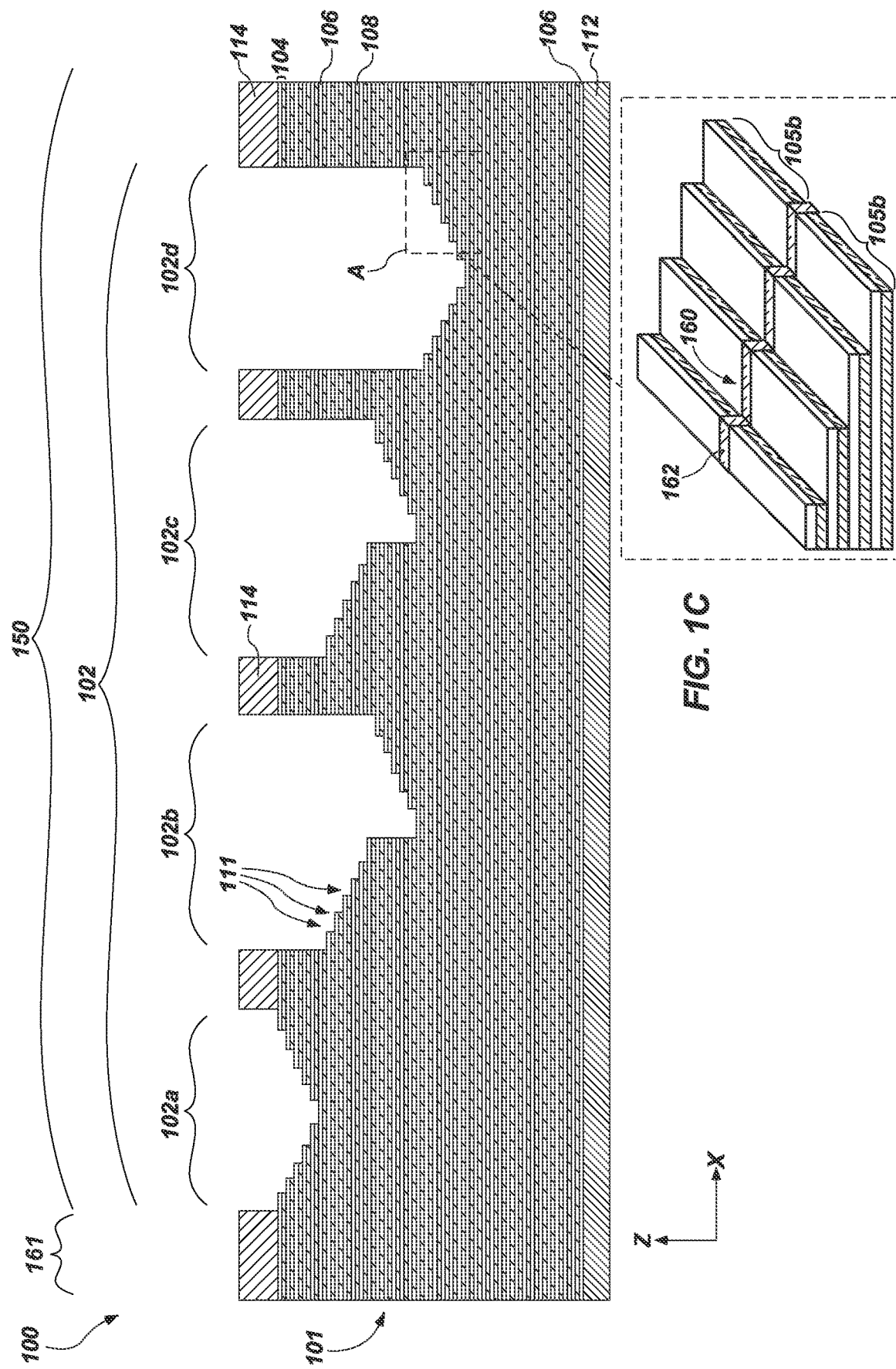

FIG. 1C is a simplified cross-sectional view of the microelectronic device structure 100 after forming a stair step structure 102 (which may also be referred to herein as a "staircase" structure) therein. The microelectronic device structure 100 may include a stair step region 150 including the stair step structure 102 and a memory array region 161. The memory array region 161 may include vertical strings of memory cells, such as NAND memory cells. For clarity and ease of understanding the drawings and associated written description, only a portion of the memory array region 161 is illustrated in FIG. 1A.

The stair step structure 102 may, for example, include a first stair step structure 102a, a second stair step structure 102b, a third stair step structure 102c, and a fourth stair step structure 102d. Although FIG. 1C illustrates only four stair step structures 102, the disclosure is not so limited and the microelectronic device structure 100 may include fewer (e.g., one, two, three) or more (e.g., five, six, seven, eight) stair step structures 102. Each of the stair step structures 102 may be referred to herein as a so-called "stadium" since the stair step structures 102 include steps 111 facing (e.g., opposing) one another.

With continued reference to FIG. 1C, after forming the slots 160 (FIG. 1B), a photoresist material may be formed over the stack structure 101 and openings (corresponding to the locations of the first stair step structure 102a, the second stair step structure 102b, the third stair step structure 102c, and the fourth stair step structure 102d) are formed through the photoresist material. The stair step structure 102 may include tiers 104 of the insulative material 106 and the other insulative material 108. Each of the tiers 104 may include one (1) of the insulative materials 106 and one (1) of the other insulative materials 108.

An uppermost tier 104 of the alternating levels of the insulative material 106 and the other insulative material 108 may be exposed to etch chemistries through the openings over each of the stair step structures 102. After removing the uppermost tier 104 through the openings, the photoresist material may be exposed to a trim chemistry to remove portions of the photoresist material and expose portions of the uppermost tier 104 corresponding to a width (in the x-direction) of a step 111. After exposing a new portion of the uppermost tier 104, the stack structure 101 is exposed to etch chemistries to remove another tier 104 through the photoresist material and form another step 111 in the stair step structures 102. The process of trimming the photoresist and etching the tiers 104 may be repeated a desired number of times. Thereafter, a so-called "chop mask" may be formed over some of the stair step structures 102 and/or portions of some of the stair step structures 102 and the exposed tiers 104 may be exposed to etch chemistries to etch through some of the exposed tiers 104 and form the stair step region 150 illustrated in FIG. 1C.

Although FIG. 1C illustrates only a particular number of tiers 104, the disclosure is not so limited. In some embodiments, the stack structure 101 includes a desired quantity of tiers 104, such as thirty-two (32) tiers 104. In other embodiments, the stack structure 101 includes a different number of tiers 104, such as less than thirty-two (32) of the tiers 104 (e.g., less than or equal to thirty (30) of the tiers 104, less than or equal to twenty (20) of the tiers 104, less than or equal to ten (10) of the tiers 104); or greater than thirty-two (32) of the tiers 104 (e.g., greater than or equal to fifty (50) of the tiers 104, greater than or equal to one hundred (100) of the tiers 104) of the insulative material 106 and the other insulative material 108.

The tiers 104 may each include steps 111 defined by edges (e.g., horizontal edges) of the tiers 104. As shown in FIG. 1C, in some embodiments, the steps 111 of the stair step structures 102 (which may also be referred to herein as "staircase" structures) are arranged in order, such that steps 111 directly horizontally adjacent one another (e.g., in the x-direction) correspond to tiers 104 of the stack structure 101 directly vertically adjacent one another. In additional embodiments, the steps 111 of the stair step structures 102 are arranged out of order, such that at least some steps 111 of the stair step structures 102 directly horizontally adjacent one another in the horizontal direction correspond to tiers 104 of stack structure 101 not directly vertically adjacent one another.

An etch stop material 114 may overlie the stair step structures 102. The etch stop material 114 may comprise, for example, one or more of polysilicon, aluminum oxide, magnesium oxide (MgO), calcium oxide (CaO), or cerium oxide ($CeO_2$). In some embodiments, the etch stop material 114 comprises polysilicon.

With reference to box A of FIG. 1C, illustrating an enlarged portion of a portion of the fourth stair step structure 102d, the slot 160 may separate the stair step structure 102 into the first sub-block 105a and the second sub-block 105b.

Figure 1D:
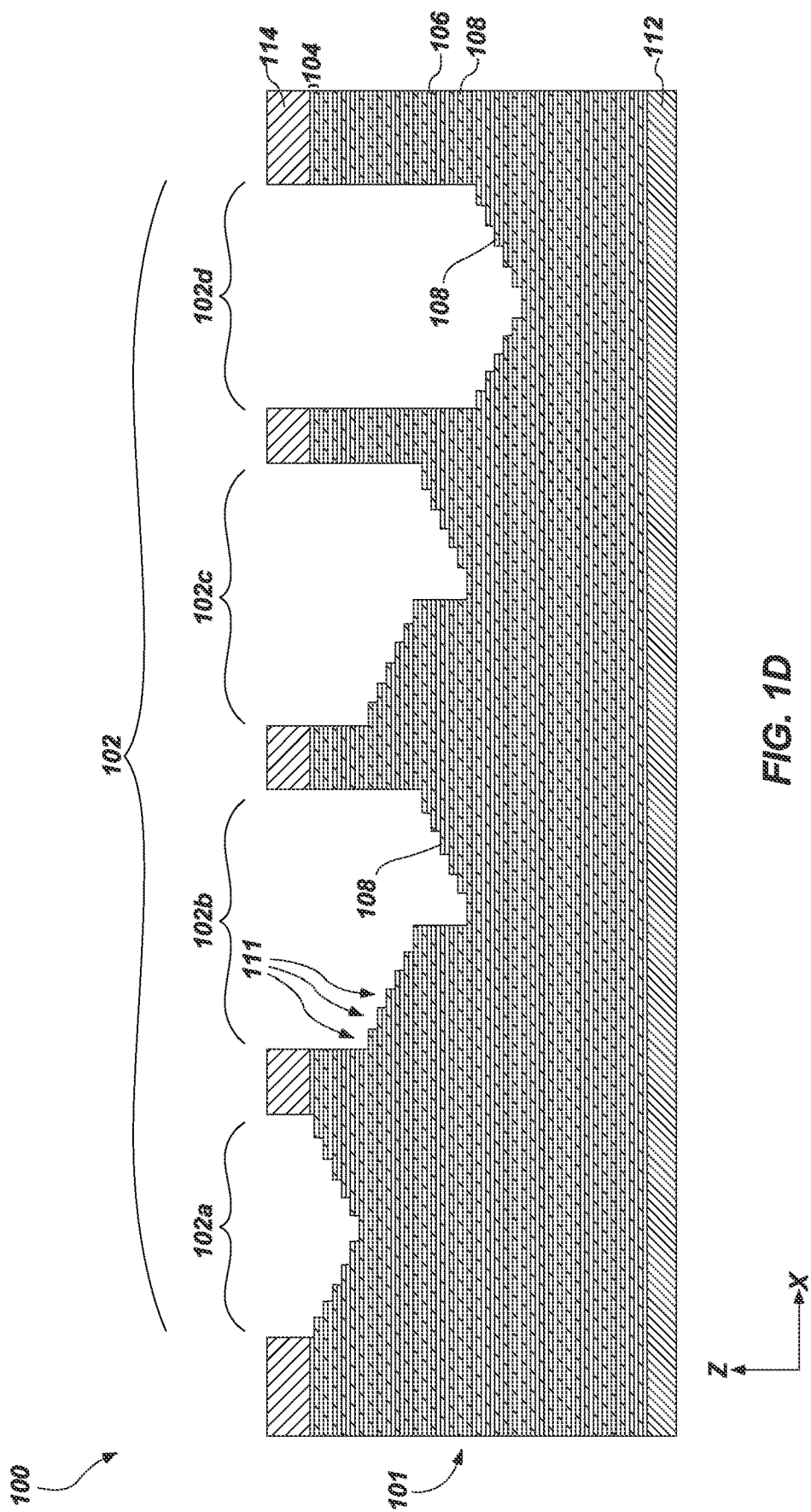

Referring to FIG. 1D, an uppermost insulative material 106 of each of the tiers 104 may be removed at the steps 111 of the stair step structures 102 to expose the underlying other insulative material 108. In some embodiments, the stack structure 101 is exposed to a wet etch chemistry to remove the exposed portions of the uppermost insulative materials 106. The wet etch chemistry may comprise, for example, one or more of hydrofluoric acid, ammonium fluoride ($NH_4F$), or hydrochloric acid. In other embodiments, the portions of the uppermost insulative materials 106 are removed by exposing the stack structure 101 to a dry etch chemistry such as, for example, one or more of carbon tetrafluoride ($CF_4$), difluoromethane ($CH_2F_2$), fluoroform ($CHF_3$), a mixture of hexafluoroethane and hexafluoropropylene ($C_2F_6/C_3F_6$), or a mixture of hexafluoropropylene and hydrogen ($C_3F_6/H_2$).

Figure 1E:
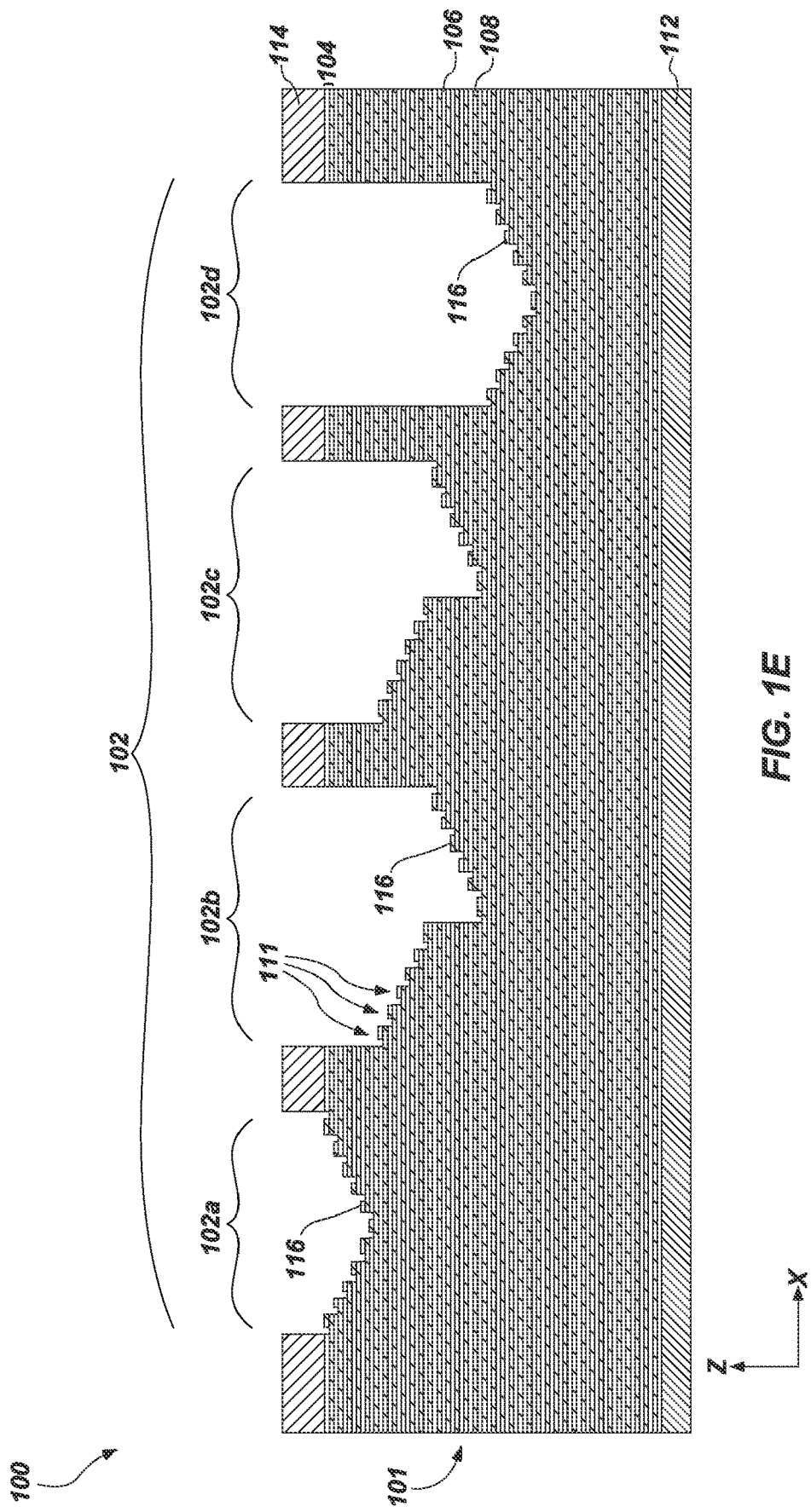

With reference to FIG. 1E, after removing portions of the uppermost insulative materials 106 at the steps 111 of the stair step structures 102, isolated nitride structures 116 may be formed and patterned over the exposed portions of the other insulative materials 108 at the steps 111 of the stair step structures 102. The isolated nitride structures 116 may be directly adjacent to (e.g., overlie) and contact the other insulative materials 108. The isolated nitride structures 116 may extend over surfaces (e.g., substantially all exposed surfaces) of the other insulative materials 108. The isolated nitride structures 116 may be formed by forming a nitride material over the microelectronic device structure 100 by one or more of ALD, PVD, CVD, PECVD, or LPCVD. In some embodiments, the nitride material is conformally formed over the microelectronic device structure 100. After forming the nitride material over the microelectronic device structure 100, the nitride material may be exposed to a plasma to densify portions of the nitride material. For example, horizontal portions of the nitride material (e.g., portions of the nitride material extending in the x-direction) may be densified relative to vertically extending portions (e.g., portions of the nitride material extending in the z-direction) of the nitride material. In some embodiments, the plasma includes an argon plasma. However, the disclosure is not so limited and the plasma may include other materials.

After exposing the nitride material to the plasma, the nitride material may be exposed to an etch chemistry to selectively remove less dense portions of the nitride material relative to the more dense portions of the nitride material and form the isolated nitride structures 116. The etch chemistry may comprise, for example, hydrofluoric acid.

The isolated nitride structures 116 may be physically isolated from each other. For example, the isolated nitride structure 116 on the other insulative material 108 of one tier 104 may be physically isolated from the isolated nitride structure 116 of other tiers 104. The isolated nitride structures 116 may each comprise silicon nitride. In some embodiments, the isolated nitride structures 116 comprise the same material composition as the other insulative material 108. In other embodiments, the isolated nitride structures 116 comprise the same material as the other insulative material 108 and exhibit a greater density than the other insulative material 108.

The isolated nitride structures 116 may have a thickness within a range from about 5 nm to about 50 nm, such as from about 5 nm to about 10 nm, from about 10 nm to about 20 nm, from about 20 nm to about 30 nm, from about 30 nm to about 40 nm, or from about 40 nm to about 50 nm. In some embodiments, a thickness of the isolated nitride structures 116 varies depending on a distance of the portion of the other insulative materials 108 from the upper surface of the stair step region 150 (FIG. 1C) on which the isolated nitride structures 116 are formed. In some embodiments, isolated nitride structures 116 located more proximate an upper surface of the stair step region 150 have a greater thickness in the vertical direction than isolated nitride structures 116 located farther from the upper surface of the stair step region 150 (e.g., isolated nitride structures 116 located more proximate to the source structure 112).

Figure 1F:
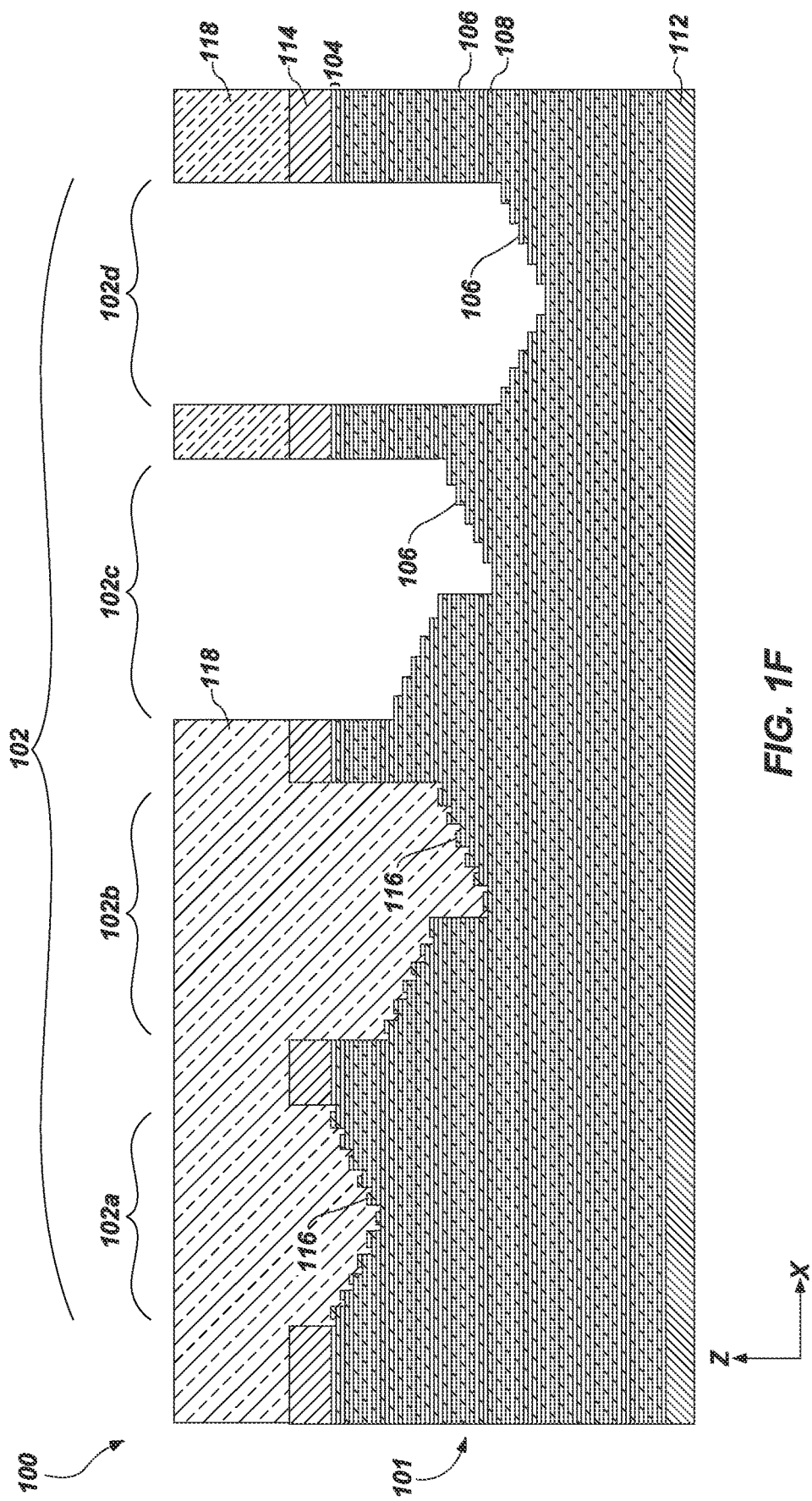

Referring to FIG. 1F, after forming the isolated nitride structures 116, a photoresist material 118 may be formed and patterned over the microelectronic device structure 100. The photoresist material 118 may overlie the first stair step structure 102a and the second stair step structure 102b and openings may be formed in the photoresist material 118 at locations corresponding to the third stair step structure 102c and the fourth stair step structure 102d.

The isolated nitride structures 116 and the exposed other insulative material 108 at the steps 111 (FIG. 1E) of the third stair step structure 102c and the fourth stair step structure 102d may be removed to expose the underlying insulative material 106. The isolated nitride structures 116 and the exposed other insulative material 108 may be removed by, for example, exposing the isolated nitride structures 116 and the exposed other insulative material 108 to hydrofluoric acid. The isolated nitride structure 116 of the first stair step structure 102a and the second stair step structure 102b may remain because they are protected by the photoresist material 118.

Figure 1G:
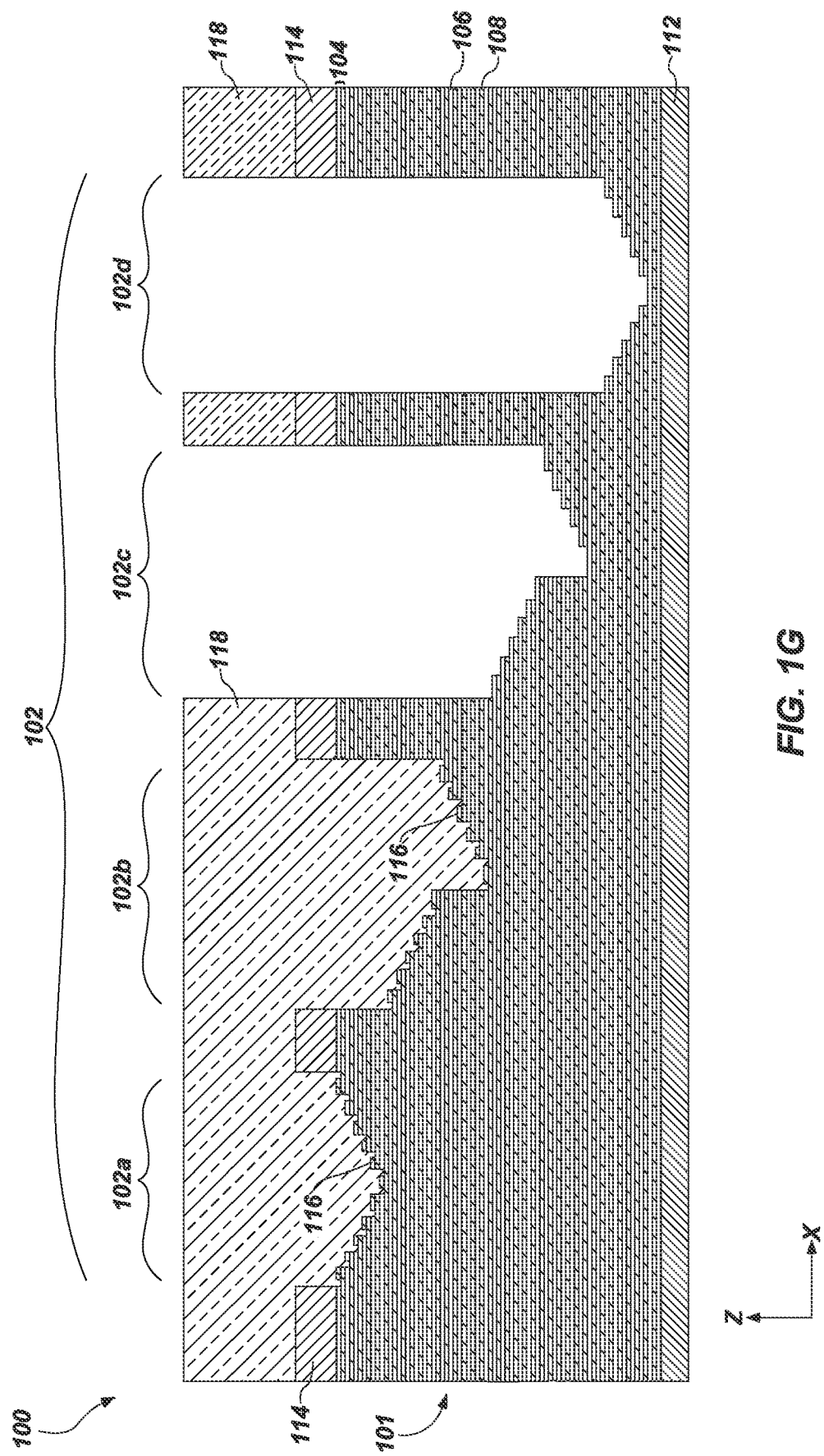

With reference to FIG. 1G, the third stair step structure 102c and the fourth stair step structure 102d may be exposed to etch chemistries to remove portions of tiers 104 of the insulative material 106 and the other insulative material 108 exposed within the openings and in the photoresist material 118 to deepen the third stair step structure 102c and the fourth stair step structure 102d. In some embodiments, the microelectronic device structure 100 is sequentially exposed to an etch chemistry formulated to selectively remove the insulative material 106 with respect to the other insulative material 108, followed by exposing the microelectronic device structure 100 to an etch chemistry formulated to selectively remove the other insulative material 108 with respect to the insulative material 106. The process is repeated until a desired number of tiers 104 are removed. In some embodiments, the other insulative material 108 is exposed in the third stair step structure 102c and the fourth stair step structure 102d.

By way of nonlimiting example, one or more etchants employed to selectively remove the insulative material 106 with respect to the other insulative material 108 may include one or more of $NH_3$, $NF_3$, $CF_4$, and $O_2$ (e.g., $NH_3$ and one of $NF_3$ and $CH_4$). In addition, one or more etchants employed to selectively remove the other insulative material 108 with respect to the insulative material 106 may include one or more of $CF_4$, $NF_3$, $O_2$, $N_2$, $SF_6$, $CH_2F_2$, or $CH_3F$. However, the disclosure is not so limited and the chemistries may comprise materials other than those described above.

Figure 1H:
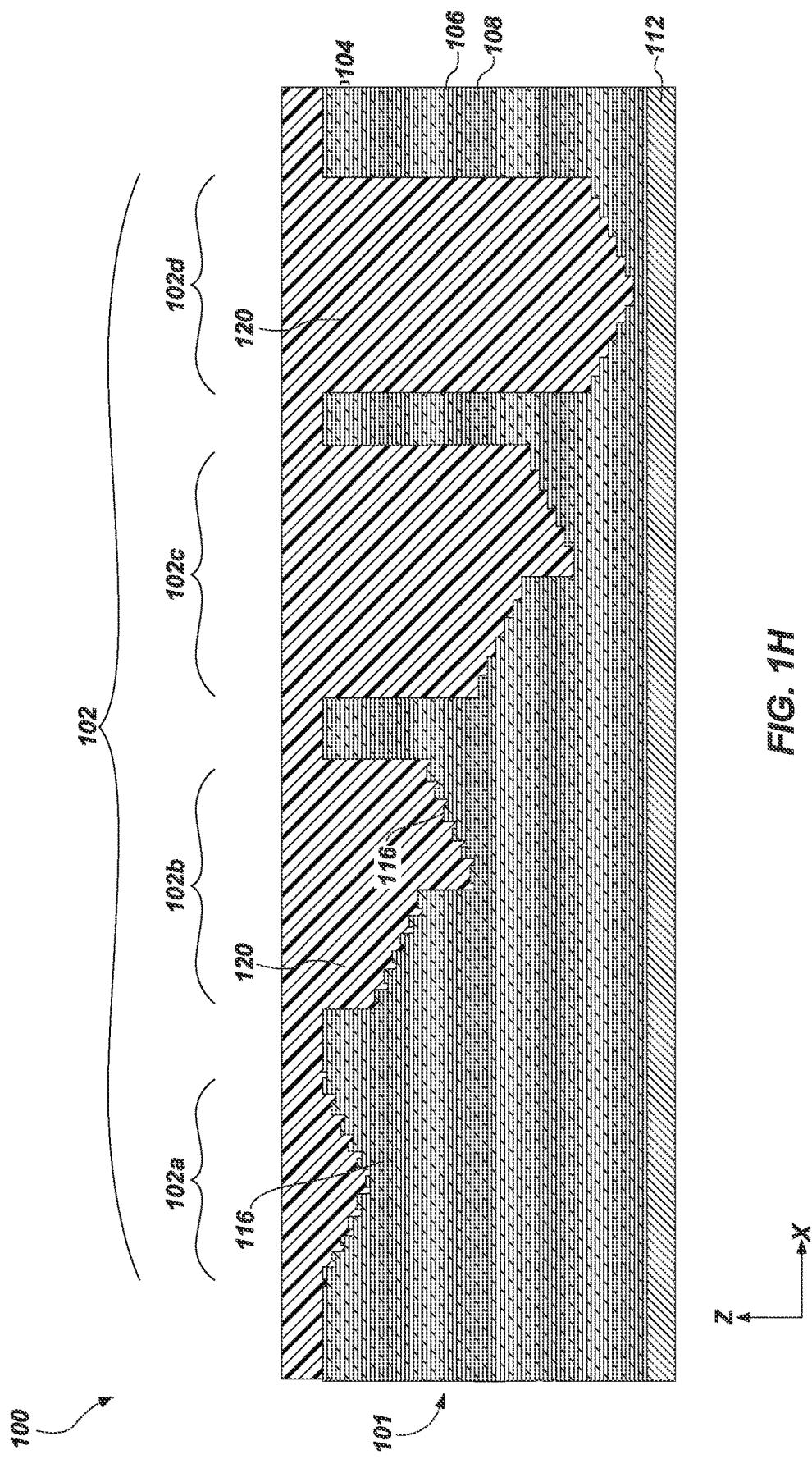
Figure 11:
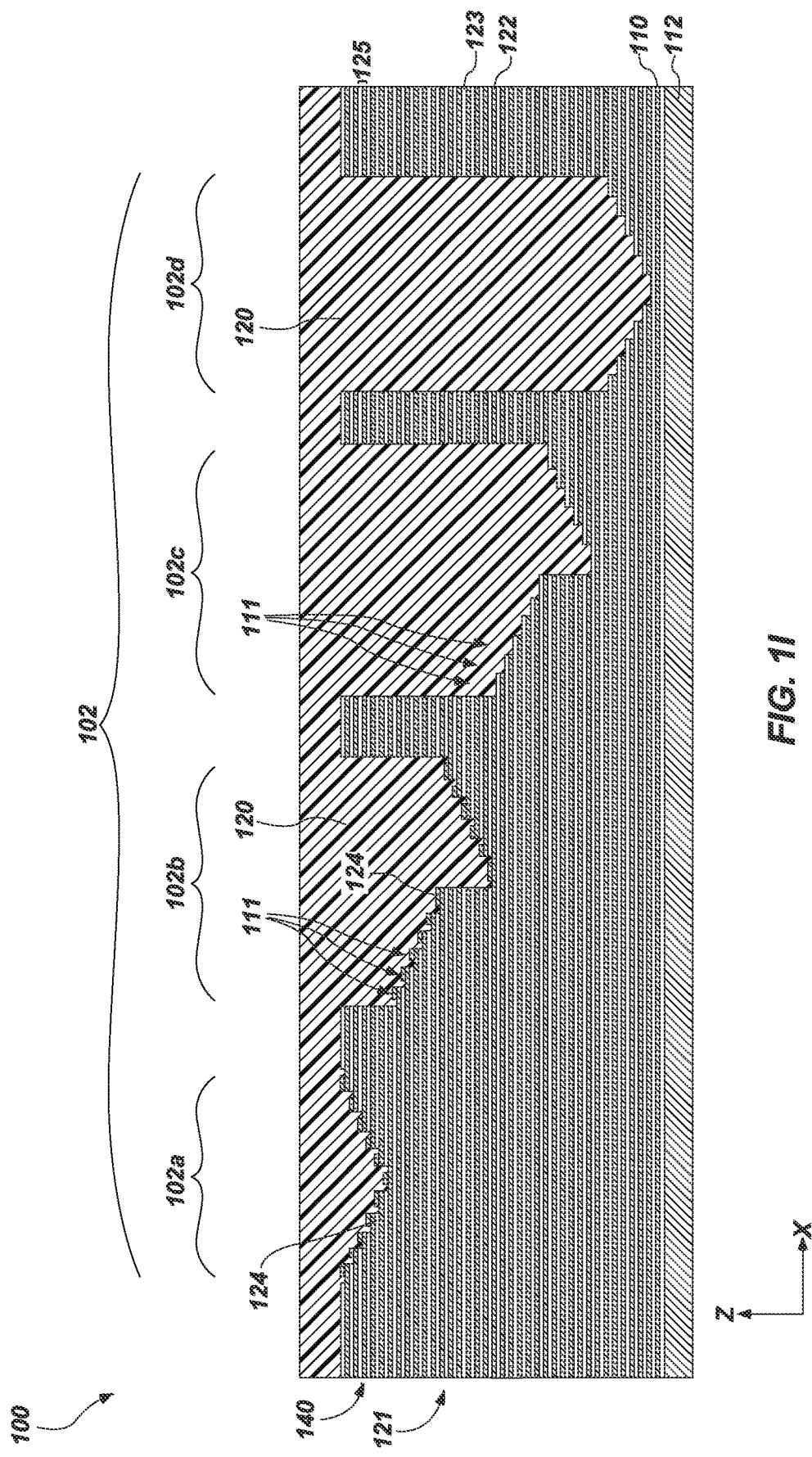

Referring to FIG. 1H, the photoresist material 118 (FIG. 1G) and the etch stop material 114 (FIG. 1G) may be removed from the stack structure 101. In some embodiments, the etch stop material 114 is exposed to a dry etch chemistry to remove the etch stop material 114. Employed dry etchants may, for example, include one or more of $Cl_2$, HBr, $O_2$ (e.g., a mixture of $Cl_2$, HBr, and $O_2$), or $SF_6$ (e.g., a mixture of $SF_6$ and $O_2$).

After removing the photoresist material 118 and the etch stop material 114, a dielectric material 120 may be formed over the stack structure 101, and may fill openings in the stack structure 101 at least partially defining the stair step structures 102 of the stair step region 150 (FIG. 1C). The dielectric material 120 may comprise an oxide material, such as silicon dioxide. In some embodiments, the dielectric material 120 comprises the same material composition as the insulative material 106. The dielectric material 120 may be formed by one or more of ALD, PVD, CVD, PECVD, or LPCVD.

In some embodiments, the dielectric material 120 is exposed to a chemical mechanical planarization (CMP) process to form a substantially planar upper surface.

Referring to FIG. 1I, the other insulative material 108 (FIG. 1H) may be removed and replaced with electrically conductive structures 122 and the isolated nitride structures 116 (FIG. 1H) may be removed and replaced with electrically conductive pad structures 124, which may also be referred to herein as electrically conductive landing pads. The other insulative material 108 may be removed by conventional methods. For example, slots 135 (FIG. 1J) may be formed to vertically extend through the stack structure 101 (FIG. 1H) and then the isolated nitride structures 116 and at least some of the other insulative material 108 (FIG. 1H) of the tiers 104 (FIG. 1H) may be selectively removed through the slots 135. By way of nonlimiting example, the stack structure 101 (FIG. 1H) may be exposed to one or more wet etchants including one or more of nitric acid, phosphoric acid, sulfuric acid, ammonium fluoride, or ammonium bifluoride. Thereafter, conductive material may be deposited within open volumes formed through the extraction of the isolated nitride structures 116 and the other insulative material 108 to form the electrically conductive pad structures 124 and a conductive stack structure 121 including a vertically alternating arrangement of the electrically conductive structures 122 and electrically insulative structures 123 (formed from the insulative material 106 (FIG. 1H)) arranged in tiers 125 (corresponding to the tiers 104 (FIG. 1H)).

In some embodiments, about one half of the stair step structures 102 include the electrically conductive pad structures 124 at the steps 111 thereof. In other embodiments, more than half of the stair step structures 102 include the electrically conductive pad structures 124. For example, all of the stair step structures other than the lowermost stair step structure (e.g., the fourth stair step structure 102d) include the electrically conductive pad structures 124.

The electrically conductive structures 122 may comprise access lines, which may also be referred to as word lines. The electrically conductive structures 122 and the electrically conductive pad structures 124 may independently comprise an electrically conductive material, such as, for example, tungsten, titanium, nickel, platinum, rhodium, ruthenium, iridium, aluminum, copper, molybdenum, silver, gold, a metal alloy, a metal-containing material (e.g., metal nitrides, metal silicides, metal carbides, metal oxides), a material including at least one of titanium nitride (TiN), tantalum nitride (TaN), tungsten nitride (WN), titanium aluminum nitride (TiAlN), iridium oxide ($IrO_x$), ruthenium oxide ($RuO_x$), alloys thereof, a conductively-doped semiconductor material (e.g., conductively-doped silicon, conductively-doped germanium, conductively-doped silicon germanium, etc.), polysilicon, other materials exhibiting electrical conductivity, or combinations thereof. In some embodiments, the electrically conductive structures 122 and the electrically conductive pad structures 124 comprise the same material composition. In some embodiments, the electrically conductive structures 122 and the electrically conductive pad structures 124 comprise tungsten.

Since the other insulative material 108 is replaced with the electrically conductive structures 122, formation of the electrically conductive structures 122 may be referred to as a so-called "replacement gate" process.

Replacement of the lowermost other insulative material 108 (FIG. 1H) through the slots 135 (FIG. 1J) may form a select gate structure 110 (FIG. 1I) comprising an electrically conductive material, which may comprise the same materials described above with reference to the electrically conductive structures 122. As will be described with reference to FIG. 1J, the select gate structure 110 may comprise a first portion (the first select gate structure 110a) and a second portion (the second select gate structure 110b) electrically isolated from each other by the slot 160 (FIG. 1J). In some embodiments, the select gate structure 110 comprises tungsten. In other embodiments, the select gate structure 110 comprises polysilicon. At least one lower electrically conductive structure 122 may be employed as at least one select gate structure 110, which may comprise a source side select gate of the microelectronic device structure 100. In some embodiments, a single (e.g., only one) electrically conductive structure 122 of a vertically lowermost tier 125 of the stack structure 121 is employed as a lower select gate (e.g., a SGS) of the microelectronic device structure 100.

FIG. 1J is a simplified top view of the microelectronic device structure 100 after forming the select gate structure 110 (FIG. 1I), the electrically conductive structures 122, and the electrically conductive pad structures 124 through the slots 135. For clarity, the dielectric material 120 (FIG. 1I) is not illustrated in FIG. 1J. In FIG. 1J, a width (in the y-direction) of the slot 160 and the dielectric material 162 are exaggerated for clarity. In addition, a portion of the dielectric material 162 of the slot 160 in FIG. 1J is illustrated in broken lines to indicate that the dielectric material 162 is located below the uppermost electrically conductive structure 122 and the electrically conductive pad structures 124 within the first stair step structure 102a and the second stair step structure 102b. It will be understood that portions of the dielectric material 162 within the first stair step structure 102a and the second stair step structure 102b may be exposed adjacent lateral edges of the electrically conductive pad structures 124. After forming the select gate structure 110, the electrically conductive structures 122, and the electrically conductive pad structures 124 through the slots 135, the slots 135 may be filled with an electrically insulative material. In some embodiments, portions of each electrically conductive structure 122 from which the isolated nitride structures 116 (FIG. 1H) were removed (e.g., the third stair step structure 102c and the fourth stair step structure 102d), may be electrically isolated from each other by the slot 160. In other words, a first portion of a particular electrically conductive structure 122 may be electrically isolated from a second portion of the particular electrically conductive structure 122 by the slot 160. By way of comparison, the electrically conductive structures 122 in each level of the stair step structures 102 including electrically conductive pad structures 124 (e.g., first stair step structure 102a and the second stair step structure 102b) may be in electrical communication with each other and not electrically isolated by the slots 160.

The first select gate structure 110a may be electrically isolated from the second select gate structure 110b by the slot 160. In other words, the slot 160 (and the dielectric material 162) may electrically isolate the first sub-block 105a from the second sub-block 105b of the conductive stack structure 121 (FIG. 1I). It will be understood that the first select gate structure 110a may extend along the width (in the y-direction) of the steps 111 in the first sub-block 105a and the second select gate structure 110b may extend along the width (in the y-direction) of the steps 111 in the second sub-block 105b. For example, the first select gate structure 110a may extend in the first sub-block 105a from the slot 160 to the left in the view of FIG. 1J and to the slot 135. The second select gate structure 110b may extend in the second sub-block 105b from the slot 160 to the right in the view of FIG. 1J to the slot 135.

The first select gate structure 110a and the second select gate structure 110b may collectively be referred to herein as the select gate structure 110. In some embodiments, since the isolated nitride structures 116 (FIG. 1H) are removed from the lowermost stair step structures 102 (the third stair step structure 102c and the fourth stair step structure 102d), when the conductive materials are deposited through the slots 135 (FIG. 1J), the first select gate structure 110a of the first sub-block 105a does not short to the second select gate structure 110b of the second sub-block 105b (FIG. 1J), as will be described below.

With continued reference to FIG. 1J, replacement of the uppermost other insulative material 108 (FIG. 1H) may form another select gate structure 140, such as upper select gate(s) (e.g., drain side select gate(s) (SGDs)) of the microelectronic device structure 100. Accordingly, in some embodiments, upper electrically conductive structure(s) 122 of the stack structure 121 (FIG. 1I) may be employed as (and comprise) upper select gate(s) (e.g., drain side select gate(s) (SGDs)). In some embodiments, horizontally-neighboring electrically conductive structures 122 of a vertically uppermost tier 125 of the stack structure 121 are employed as upper select gates (e.g., SGDs) of the microelectronic device structure 100. In some embodiments, the another select gate structures 140 are separated from each other by the slots 135.

Figure 1K:
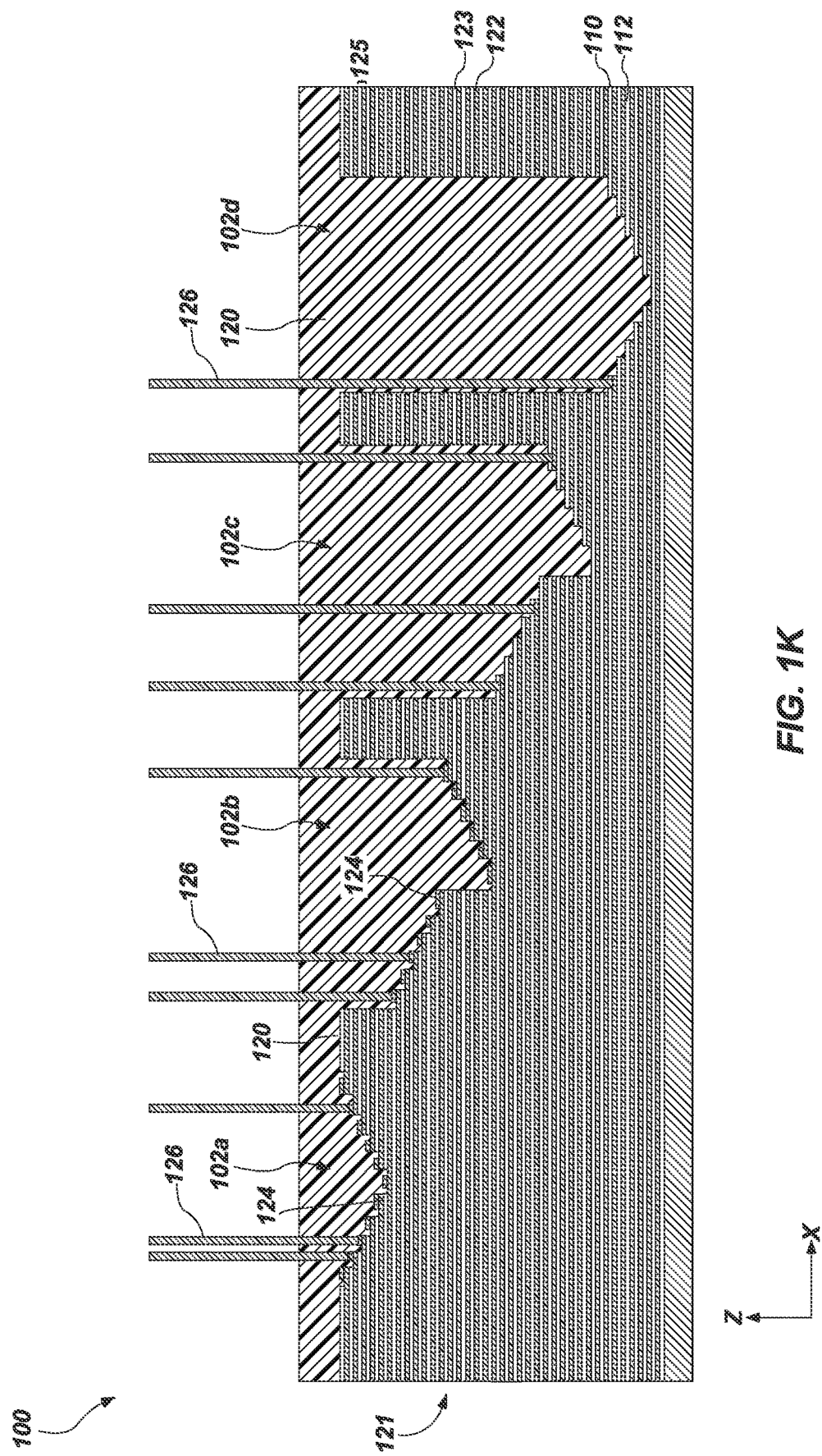

Referring to FIG. 1K, after forming the electrically conductive structures 122 and the electrically conductive pad structures 124, electrically conductive contact structures 126 (only some of which are illustrated in FIG. 1K for clarity) may be formed through the dielectric material 120 to individually contact the electrically conductive pad structures 124 of the first stair step structure 102a and the second stair step structure 102b and the electrically conductive structures 122 of the third stair step structure 102c and the fourth stair step structure 102d. A width (in the x-direction) of the electrically conductive contact structures 126 may be less than a width of the electrically conductive pad structures 124. In addition, a length (in the y-direction) of the electrically conductive contact structures 126 may be less than a length of the electrically conductive pad structures 124. In some embodiments, a height (in the z-direction) of the electrically conductive pad structures 124 may be greater than a height of their corresponding electrically conductive lines 122. In some embodiments, the electrically conductive pad structures 124 extend along a length of the steps 111 in the y-direction. In some embodiments, the electrically conductive pad structures 124 do not cover an entire surface of the steps 111 in the x-direction.

Since the isolated nitride structures 116 (FIG. 1F) were removed from at least some of the stair step structures 102, at least some of the stair step structures 102 may not include the conductive pad structures 124. For example, the stair step structure 102 located adjacent to the select gate structure 110 (e.g., the lowermost stair step structures; the fourth stair step structure 102d and the third stair step structure 102c) may not include the conductive pad structures 124. Since the isolated nitride structures 116 were removed from the stair step structures 102 located adjacent to the select gate structure 110 (e.g., the first select gate structure 110a (FIG. 1J), the second select gate structure 110b (FIG. 1J)), the lowermost stair step structures 102 may not include materials that may short to the select gate structure 110, such as by shorting the first select gate structure 110a to the second select gate structure 110b (FIG. 1J). By way of comparison, if the isolated nitride structures 116 were not removed from over the lowermost stair step structures 102 (such as from over the other insulative material 108 (FIG. 1H)) that is replaced with the electrically conductive material through the slot 135 (FIG. 1J) to become the first select gate structure 110a and the second select gate structure 110b, the electrically conductive material may undesirably span across adjacent blocks (e.g., the first sub-block 105a (FIG. 1J) and the second sub-block 105b (FIG. 1J)) and short the select gate structures 110 (e.g., the first select gate structure 110a (FIG. 1J) and the second select gate structure 110b (FIG. 1J)) to each other.

In addition, other stair step structures 102 (e.g., the first stair step structure 102a and the second stair step structure 102b) may exhibit a reduced likelihood of punching through during formation of the electrically conductive contact structures to the individual electrically conductive structures 122 or the electrically conductive pad structures 124. By way of comparison, forming electrically conductive contact structures 126 in a conventional microelectronic device may undesirably punch through the one or more of the electrically conductive materials (e.g., the electrically conductive structures 122) of relatively shallower stadia (such as of the first stair step structure 102a and the second stair step structure 102b) since such stadia include a relatively thinner dielectric material 120 to etch through to form the electrically conductive contact structures 126.

Figure 2A:
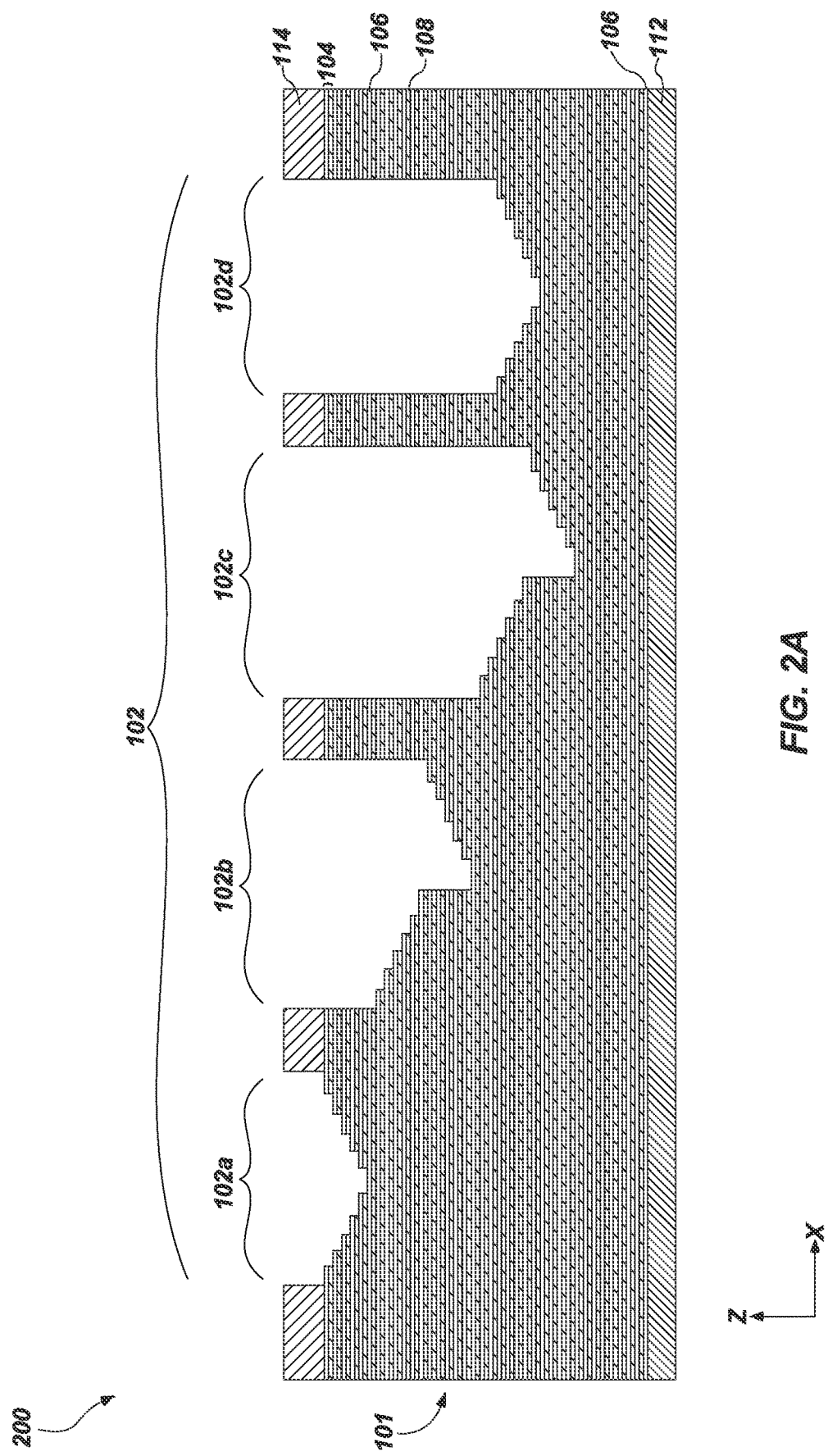
FIG. 2A through FIG. 2F are simplified cross-sectional views illustrating a method of forming a microelectronic device, in accordance with other embodiments of the disclosure.

FIG. 2A through FIG. 2F are simplified cross-sectional views illustrating a method of forming a microelectronic device structure 200, in accordance with other embodiments of the disclosure. Referring to FIG. 2A, the microelectronic device structure 200 may be substantially the same as the microelectronic device structure 100 of FIG. 1F, except that the microelectronic device structure 200 may not include the isolated nitride structures 116 or the photoresist material 118.

Figure 2B:
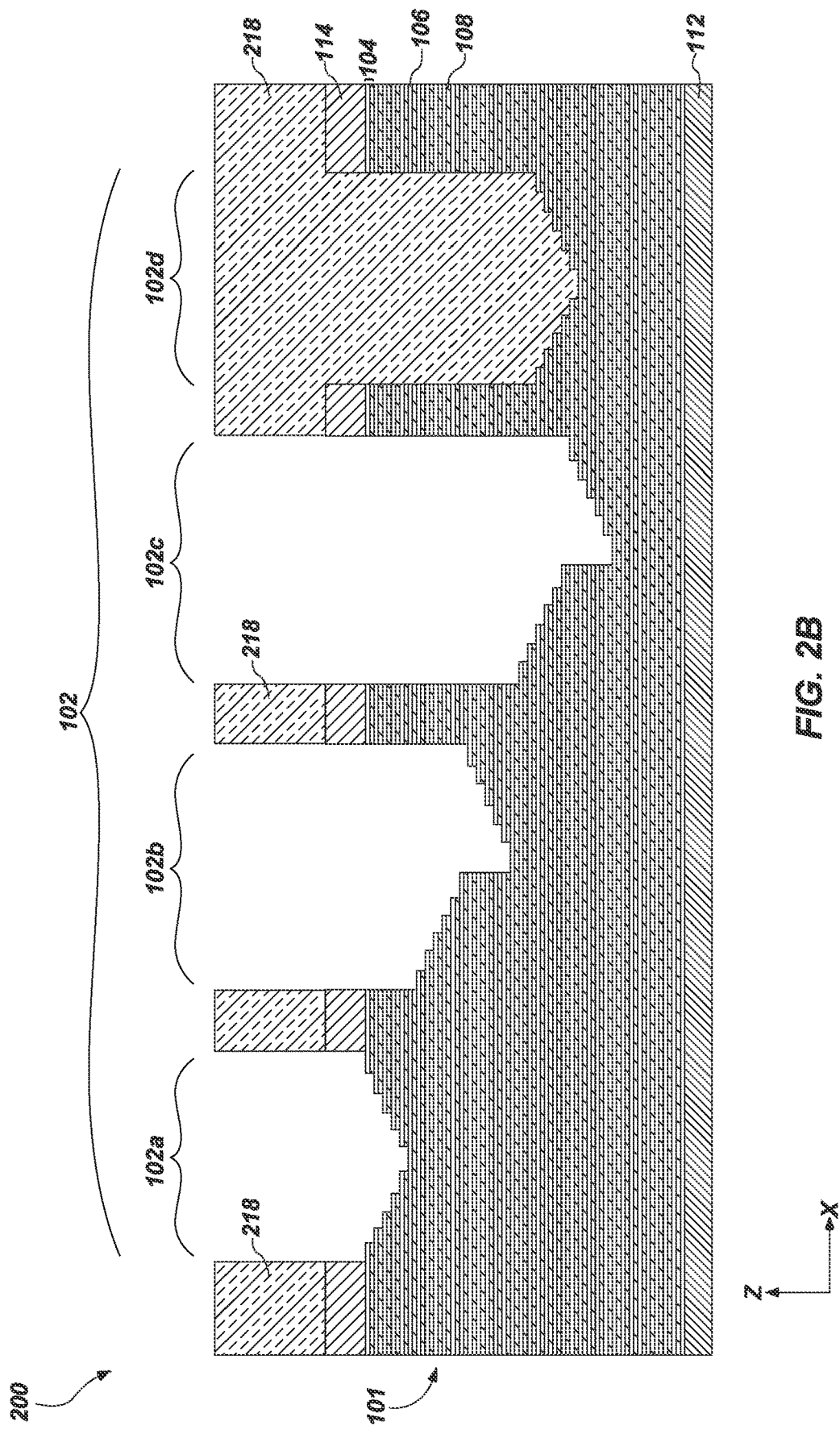

With reference to FIG. 2B, a photoresist material 218 may be formed over the microelectronic device structure 200 and patterned to expose all of the stair step structures 102 other than the lowermost stair step structure 102 (e.g., the fourth stair step structure 102d). In other words, the photoresist material 218 may be formed over all of the stair step structures 102 other than the fourth stair step structure 102d located most proximate the source structure 112. Stated in yet another way, the fourth stair step structure 102d may remain covered by the photoresist material 218 while the other stair step structures 102 (e.g., the first stair step structure 102a, the second stair step structure 102b, and the third stair step structure 102c) are exposed through the photoresist material 218.

Figure 2C:
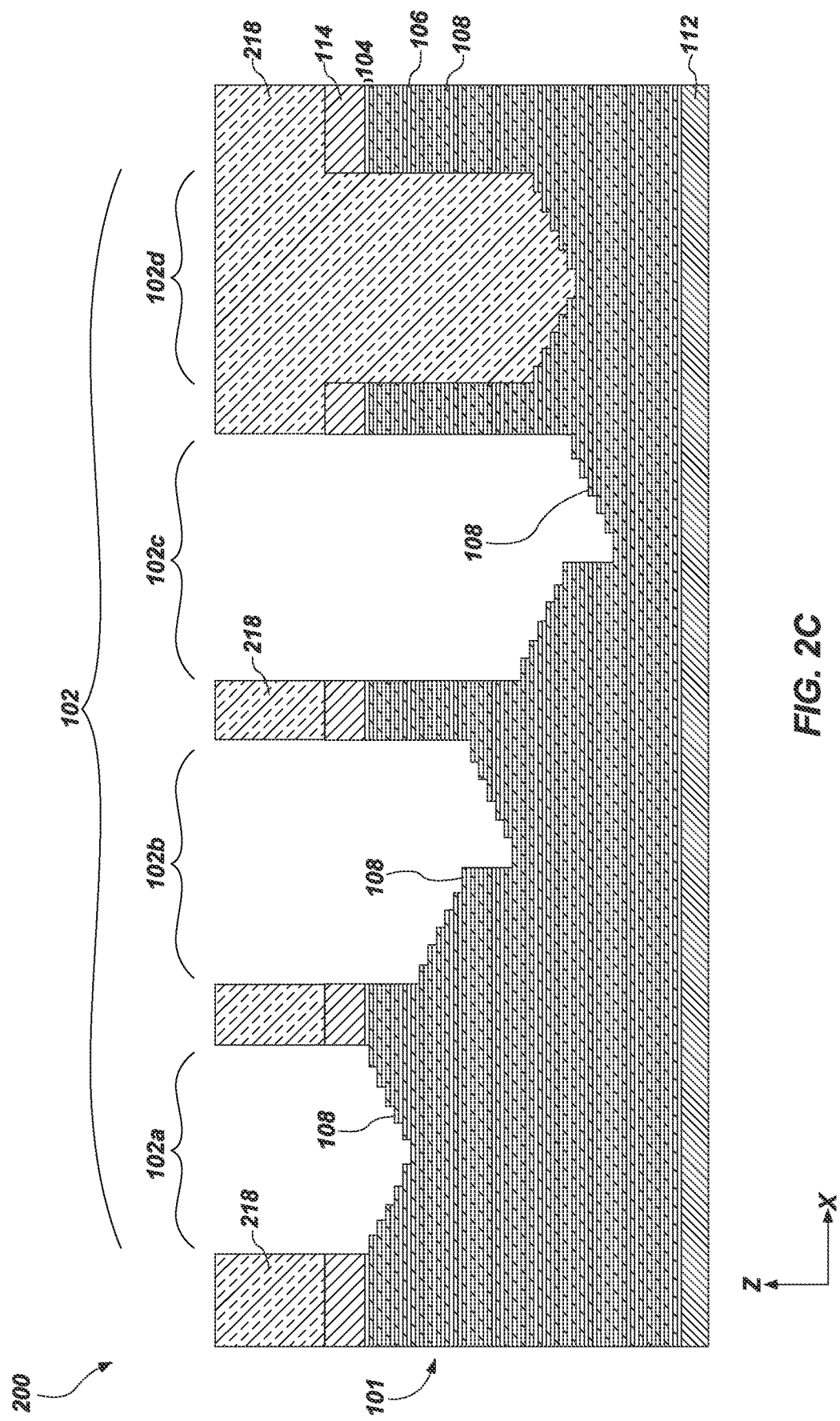

Referring to FIG. 2C, an uppermost level of the insulative material 106 may be removed from the exposed stair step structures 102 (e.g., all of the stair step structures (the first stair step structure 102a, the second stair step structure 102b, and the third stair step structure 102c) other than the lowermost stair step structure 102 (the fourth stair step structure 102d)) to expose the other insulative material 108. Removal of the uppermost level of the insulative material 106 may be substantially the same as described above with reference to FIG. 1D.

Figure 2D:
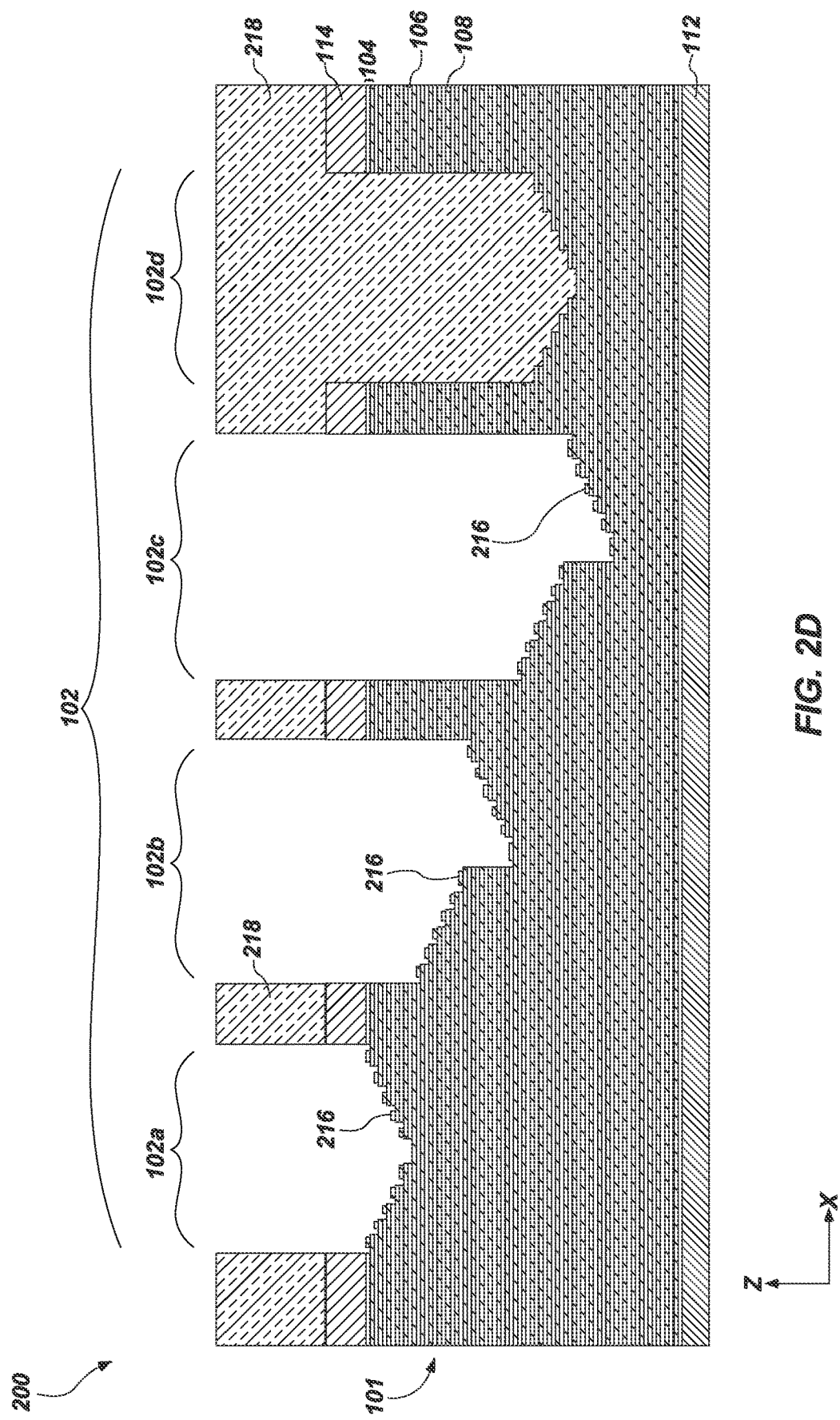

With reference to FIG. 2D, isolated nitride structures 216 may be formed and patterned in the exposed stair step structures 102 (e.g., the first stair step structure 102a, the second stair step structure 102b, and the third stair step structure 102c) and adjacent to the exposed other insulative material 108. The isolated nitride structures 216 may be formed as described above with reference to the isolated nitride structures 116 with reference to FIG. 1E. Since the lowermost stair step structure 102 (e.g., the fourth stair step structure 102d) is covered by the photoresist material 218, the isolated nitride structures 216 may not be formed in the lowermost stair step structure 102.

Figure 2E:
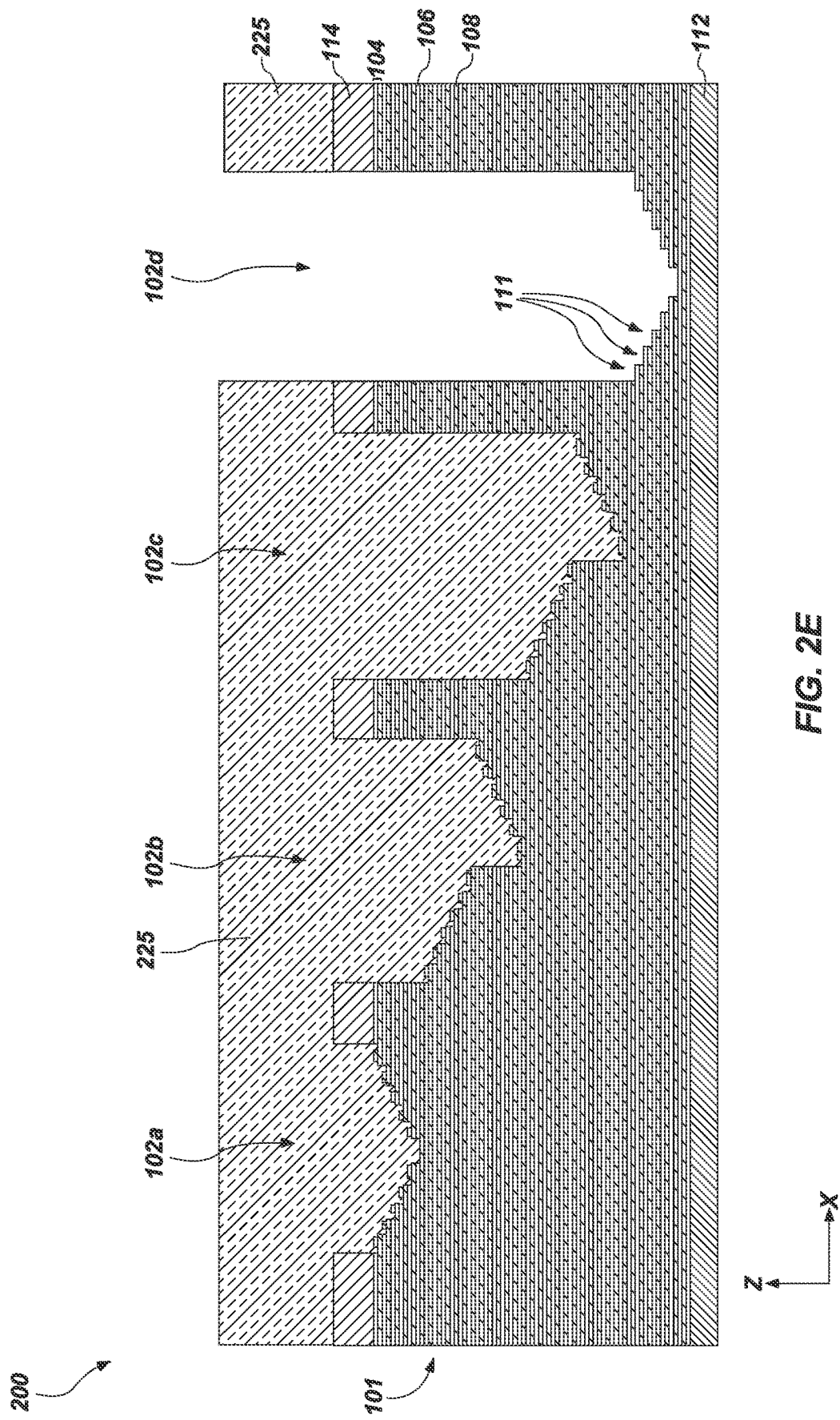

As illustrated in FIG. 2E, the photoresist material 218 (FIG. 2D) may be removed from portions of the fourth stair step structure 102d to expose the steps 111 of the fourth stair step structure 102d. After removing the photoresist material 218, another photoresist material 225 may be formed and patterned over the microelectronic device structure 200. The other photoresist material 225 may be patterned to cover all of the stair step structures 102 other than the lowermost stair step structure 102 (e.g., the fourth stair step structure 102d). The lowermost stair step structure 102 (e.g., the fourth stair step structure 102d) may be exposed through the other photoresist material 225.

Portions of the tiers 104 of the fourth stair step structure 102d may be removed through the other photoresist material 225 to deepen the fourth stair step structure 102d. Removing the tiers 104 may be substantially the same as removal of the tiers 104 described above with reference to FIG. 1G. For example, the stair step structures 102 may be sequentially exposed to an etch chemistry formulated to selectively remove the insulative material 106 with respect to the other insulative material 108, followed by exposing the stair step structures 102 to an etch chemistry formulated to selectively remove the other insulative material 108 with respect to the insulative material 106. The process is repeated until a desired number of tiers 104 are removed.

Figure 2F:
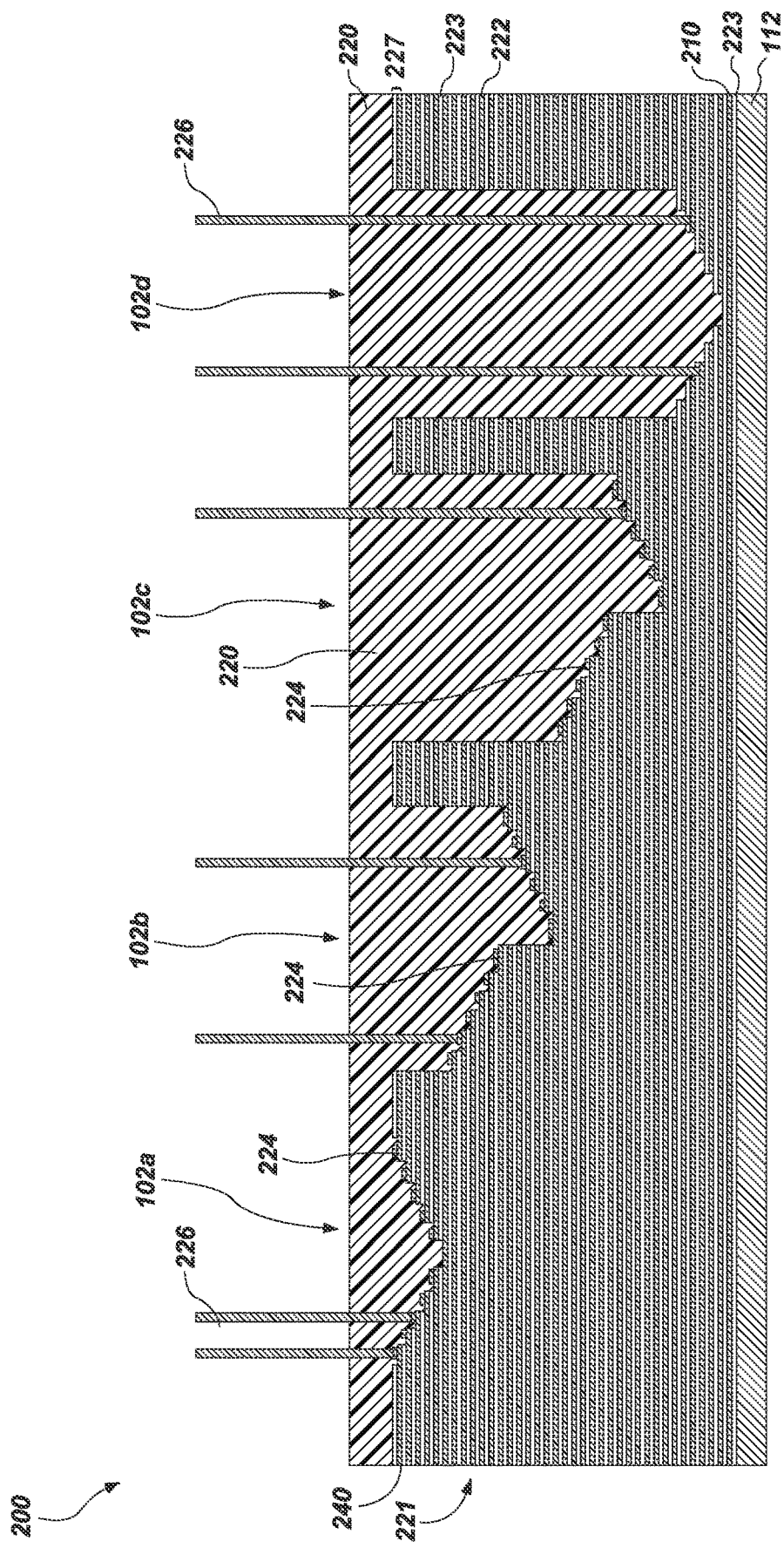

Referring to FIG. 2F, the other photoresist material 225 may be removed and a dielectric material 220 may be formed over the microelectronic device structure 200, as described above with reference to the dielectric material 120 of FIG. 1H. After forming the dielectric material 220, the other insulative material 108 may be replaced through slots (e.g., slots 135 (FIG. 1J)) with an electrically conductive material to form electrically conductive structures 222 and the isolated nitride structures 216 may be replaced with electrically conductive pad structures 224 and a conductive stack structure 221 including a vertically alternating arrangement of the electrically conductive structures 222 and electrically insulative structures 223 (formed from the insulative material 106 (FIG. 2E) arranged in tiers 227 (corresponding to the tiers 104 (FIG. 2E))). The electrically conductive structures 222 and the electrically conductive pad structures 224 may be formed in substantially the same manner as the respective electrically conductive structures 122 and the electrically conductive pad structures 124 described above with reference to FIG. 1I and FIG. 1J. For example, slots 135 may be formed in the microelectronic device structure 200 and through the tiers 104 and the other insulative material 108 may be removed through the slots 135.

As described above with reference to FIG. 1I and FIG. 1J, replacement of the lowermost other insulative material 108 (FIG. 2E) through the slot 135 (FIG. 1J) may form a select gate structure 210 comprising an electrically conductive material, which may comprise the same materials described above with reference to the electrically conductive structures 222. At least one lower electrically conductive structure 222 may be employed as at least one select gate structure 210, which may comprise a source side select gate of the microelectronic device structure 200. In some embodiments, a single (e.g., only one) electrically conductive structure 222 of a vertically lowermost tier 227 of the stack structure 121 is employed as a lower select gate (e.g., a SGS) of the microelectronic device structure 200. In addition, upper electrically conductive structure(s) 222 of the stack structure 221 may comprise another select gate structure 240 and may be employed as upper select gate(s) (e.g., drain side select gate(s) (SGDs)) of the microelectronic device structure 200. In some embodiments, horizontally-neighboring electrically conductive structures 222 of a vertically uppermost tier 125 of the stack structure 221 comprise the other select gate structures 240 and are employed as upper select gates (e.g., SGDs) of the microelectronic device structure 200.

In some embodiments, about three fourths of the stair step structures 102 include the electrically conductive pad structures 224. In other embodiments, only one of the stair step structures 102 (e.g., the fourth stair step structure 102d) include the electrically conductive pad structures 224.

As described above with reference to FIG. 1K, after forming the electrically conductive structures 222 and the electrically conductive pad structures 224, electrically conductive contact structures 226 may be formed through the dielectric material 220 to individually contact the electrically conductive pad structures 224 of the first stair step structure 102a, the second stair step structure 102b, and the third stair step structure 102c, and the electrically conductive structures 222 of the fourth stair step structure 102d. In FIG. 2F, only some of the electrically conductive contact structures 226 are shown for clarity. The electrically conductive contact structures 226 of the uppermost stair step structures 102 are in electrical communication with the electrically conductive pad structures 224. The electrically conductive contact structures 226 of the lowermost stair step structure 102 (e.g., the fourth stair step structure 102d) directly contact their respective electrically conductive structures 222. The electrically conductive pad structures 224 may have a width (in x-direction) greater than a width of the electrically conductive contact structures 226. In addition, the electrically conductive pad structures 224 may have a thickness in the vertical direction (e.g., in the z-direction) greater than a thickness of the electrically conductive structure 222 it is in electrical communication with.

In some embodiments, portions of each electrically conductive structure 222 from which the isolated nitride structures 216 (FIG. 2D) were removed (e.g., the fourth stair step structure 102d), may be electrically isolated from each other by the slot 160. By way of comparison, the electrically conductive structures 222 in each level of the stair step structures 102 including electrically conductive pad structures 224 (e.g., first stair step structure 102a, the second stair step structure 102b, and the third stair step structure 102c) may be in electrical communication with each other and not electrically isolated by the slots 160.

With continued reference to FIG. 2F, the fourth stair step structure 102d does not include the electrically conductive pad structures 224. Since the isolated nitride structures 116 (FIG. 2D) were not formed on the lowermost stair step structure (e.g., the fourth stair step structure 102d), the lowermost stair step structure 102 does not include materials that may short to the select gate structure 210 or cause the select gate structure 210 (e.g., the first select gate structure 110a (FIG. 1J), the second select gate structure 110b (FIG. 1J)) of one sub-block (e.g., the first sub-block 105a (FIG. 1J)) to short to the select gate structure 110 of another sub-block (e.g., the second sub-block 105b (FIG. 1J)). By way of comparison, conductive pad structures (such as conductive pad structures formed by removal of isolated nitride structures 216) proximate a select gate structure of conventional microelectronic devices may short to the select gate structure. Since the isolated nitride structures 216 described herein are not formed on the lowermost stair step structure 102 located proximate the select gate structure 110, the lowermost stair step structure 102 may not include materials that short to the select gate structure 110.

In addition, other stair step structures 102 (e.g., the first stair step structure 102a, the second stair step structure 102b, and the third stair step structure 102c) may exhibit a reduced likelihood of punching through during formation of the electrically conductive contact structures 226 to the individual electrically conductive structures 222 or the electrically conductive pad structures 224. By way of comparison, forming electrically conductive contact structures in a conventional microelectronic device may undesirably punch through the one or more of the electrically conductive materials (e.g., the electrically conductive structures 222) of relatively shallower stadia (such as of the first stair step structure 102a, the second stair step structure 102b, and the third stair step structure 102c) since such stadia include a relatively thinner dielectric material 220 to etch through to form the electrically conductive contact structures 226.

Figure 3A:
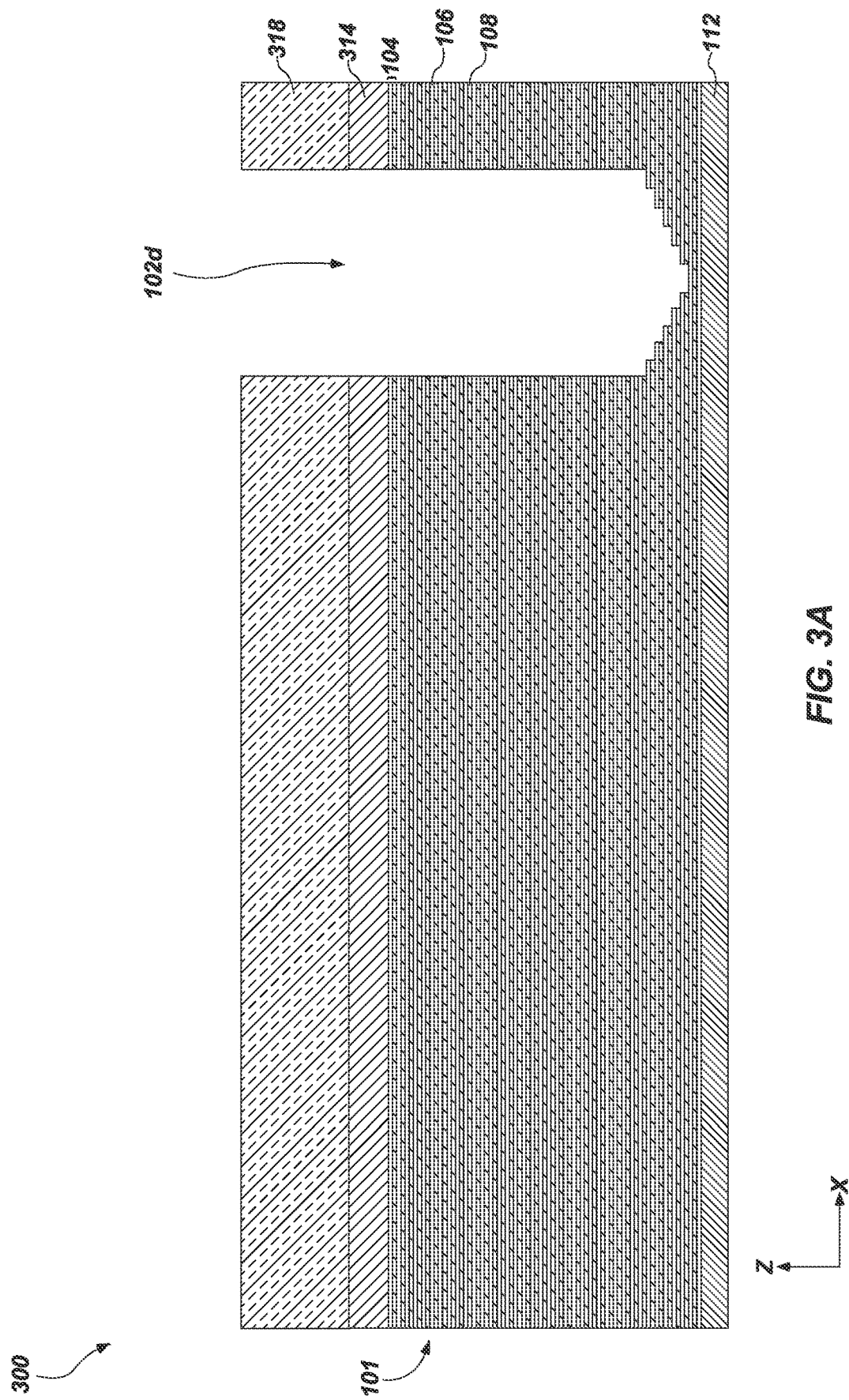
FIG. 3A and FIG. 3B are simplified cross-sectional view illustrating a method of forming a microelectronic device, in accordance with further embodiments of the disclosure.
Figure 3B:
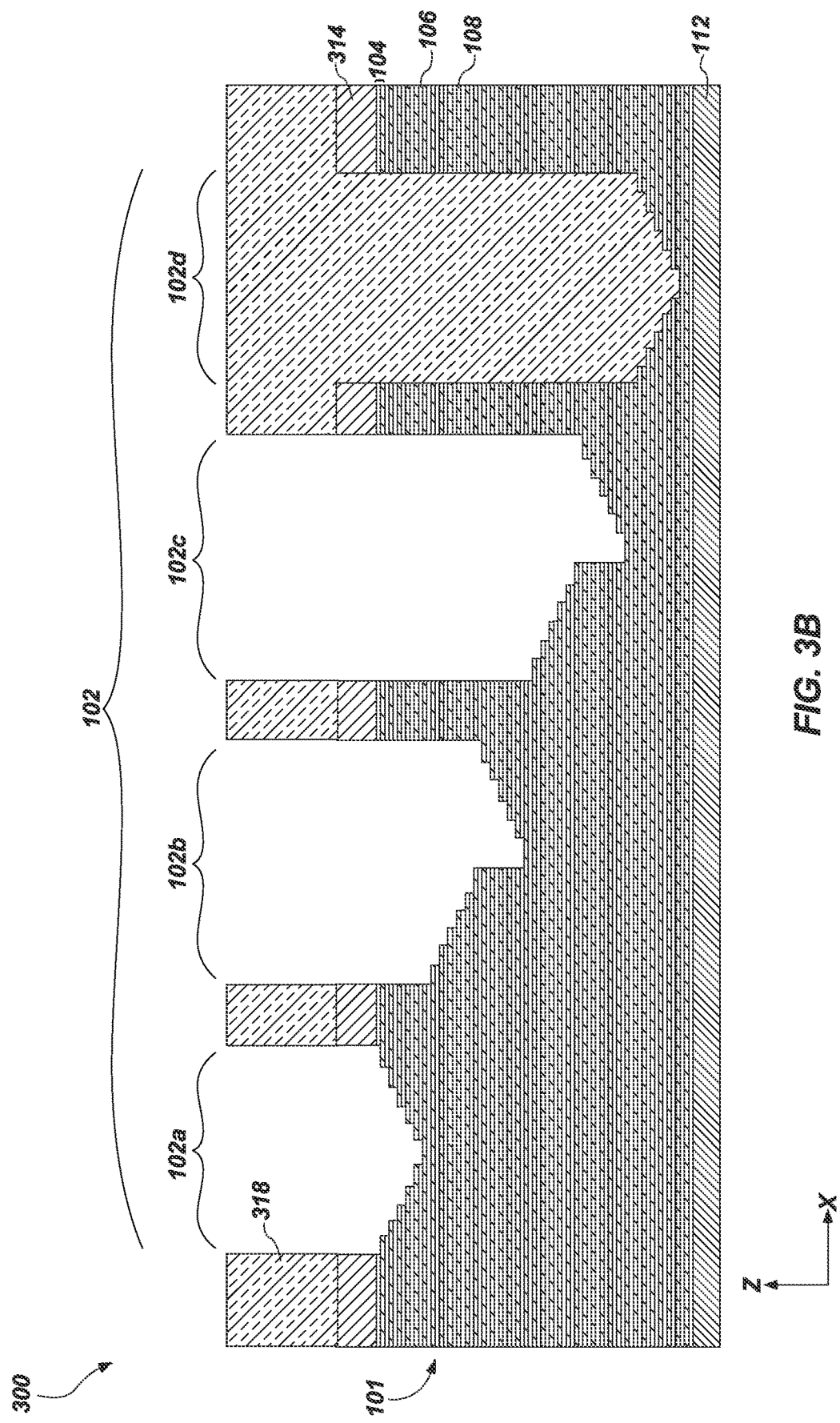

FIG. 3A and FIG. 3B illustrate a method of forming a microelectronic device structure 300, in accordance with embodiments of the disclosure. FIG. 3A is a simplified cross-sectional view of a microelectronic device structure 300. The microelectronic device structure 300 may be substantially similar to the microelectronic device structure 100 of FIG. 1C, except that the microelectronic device structure 300 may not yet include the first stair step structure 102a (FIG. 1C), the second stair step structure 102b (FIG. 1C), and the third stair step structure 102c (FIG. 1C). In addition, the microelectronic device structure 300 may include the lowermost stair step structure 102 (e.g., the fourth stair step structure 102d) located proximate the source structure 112. Accordingly, the lowermost stair step structure 102 may be formed and patterned prior to forming and patterning the other stair step structures 102 (e.g., the first stair step structure 102a, the second stair step structure 102b, and the third stair step structure 102c). An etch stop material 314 may be adjacent to (e.g., overlie) the tiers 104 of the insulative material 106 and the other insulative material 108. A photoresist material 318 may be adjacent to (e.g., overlie) the etch stop material 314.

Referring to FIG. 3B, after patterning the fourth stair step structure 102d, the other stair step structures 102 (e.g., the first stair step structure 102a, the second stair step structure 102b, the third stair step structure 102c) located distal from the source structure 112 may be patterned. The fourth stair step structure 102d may be covered with a photoresist material 318. Openings may be formed through the photoresist material 318 corresponding to locations of the first stair step structure 102a, the second stair step structure 102b, and the third stair step structure 102c. The openings may be patterned through the etch stop material 314. Each of the first stair step structure 102a, the second stair step structure 102b, and the third stair step structure 102c may be patterned as described above with reference to FIG. 2A.

After patterning the first stair step structure 102a, the second stair step structure 102b, and the third stair step structure 102c, the microelectronic device structure 300 may be fabricated in substantially the same manner as the microelectronic device structure 200 described above with reference to FIG. 2D and FIG. 2F. For example, isolated nitride structures (e.g., the isolated nitride structures 216 (FIG. 2D)) may be formed and patterned over the first stair step structure 102a, the second stair step structure 102b, and the third stair step structure 102c to form a microelectronic device substantially similar to the microelectronic device structure 200 of FIG. 2D. After forming the isolated nitride structures, a dielectric material may be formed over the microelectronic device structure 300, as described above with reference to FIG. 2F. After forming the dielectric material, the other insulative material 108 may be replaced with an electrically conductive material (e.g., the electrically conductive structures 222 (FIG. 2F)) and the isolated nitride structures 216 may be replaced with electrically conductive pad structures (e.g., electrically conductive pad structures 224 (FIG. 2F)). The electrically conductive material and the electrically conductive pad structures may be formed in substantially the same manner as the respective electrically conductive structures 122 and the electrically conductive pad structures 124 described above with reference to FIG. 1J. For example, slits may be formed in the microelectronic device and through the tiers 104 and the other insulative material 108 may be removed through the slits. The completed microelectronic device may be substantially the same as the microelectronic device structure 200 described and illustrated with reference to FIG. 2F.

Accordingly, in some embodiments, a method of forming a microelectronic device comprises forming isolated nitride structures on steps of stair step structures formed in a stack structure comprising a vertically alternating arrangement of first insulative materials and second insulative materials arranged in tiers, forming a photoresist material over some of the stair step structures, and replacing the isolated nitride structures and the second insulative material with an electrically conductive material to respectively form conductive pad structures and electrically conductive structures.

Moreover, in some embodiments, a microelectronic device comprises a stack structure comprising alternating conductive structures and insulative structures arranged in tiers, each of the tiers individually comprising a conductive structure and an insulative structure, and a stair step region within the stack structure. The stack structure comprises a lowermost stair step structure, and other stair step structures. The microelectronic device further comprises electrically conductive pad structures at end portions of the conductive structures of the other stair step structures, the lowermost stair step structure not including the electrically conductive pad structures.

Figure 4:
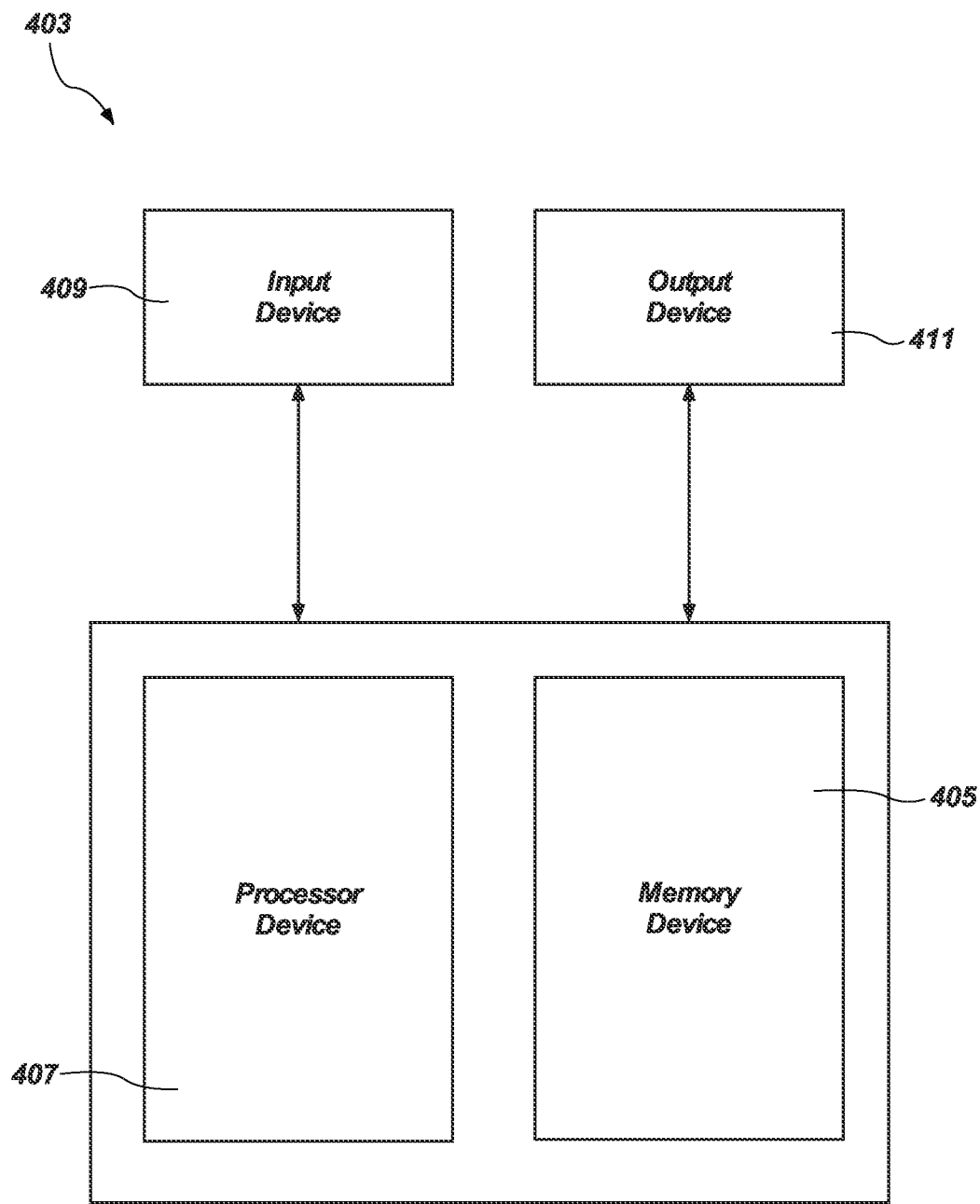
FIG. 4 is a block diagram of an illustrative electronic system, in accordance with embodiments of the disclosure.

Microelectronic devices including microelectronic device structures (e.g., the microelectronic device structures 100, 200, 300) including the stair step structures (e.g., the stair step structures 102) in accordance with embodiments of the disclosure may be used in embodiments of electronic systems of the disclosure. For example, FIG. 4 is a block diagram of an electronic system 403, in accordance with embodiments of the disclosure. The electronic system 403 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system 403 includes at least one memory device 405. The memory device 405 may include, for example, an embodiment of a microelectronic device structure previously described herein (e.g., one of the microelectronic device structures 100, 200, 300 previously described with reference to FIG. 1I, FIG. 2F, and FIG. 3B, respectively) including the stair step structures (e.g., the stair step structures 102), the uppermost stair step structures including conductive contact pads (e.g., the electrically conductive pad structures 124, 224).

The electronic system 403 may further include at least one electronic signal processor device 407 (often referred to as a "microprocessor"). The electronic signal processor device 407 may, optionally, include an embodiment of a microelectronic device structure previously described herein (e.g., one or more of the microelectronic device structures 100, 200, 300 previously described with reference to FIG. 1I, FIG. 2F, and FIG. 3B, respectively). The electronic system 403 may further include one or more input devices 409 for inputting information into the electronic system 403 by a user, such as, for example, a mouse or other pointing device, a keyboard, a touchpad, a button, or a control panel. The electronic system 403 may further include one or more output devices 411 for outputting information (e.g., visual or audio output) to a user such as, for example, a monitor, a display, a printer, an audio output jack, a speaker, etc. In some embodiments, the input device 409 and the output device 411 may comprise a single touchscreen device that can be used both to input information to the electronic system 403 and to output visual information to a user. The input device 409 and the output device 411 may communicate electrically with one or more of the memory device 405 and the electronic signal processor device 407.

Figure 5:
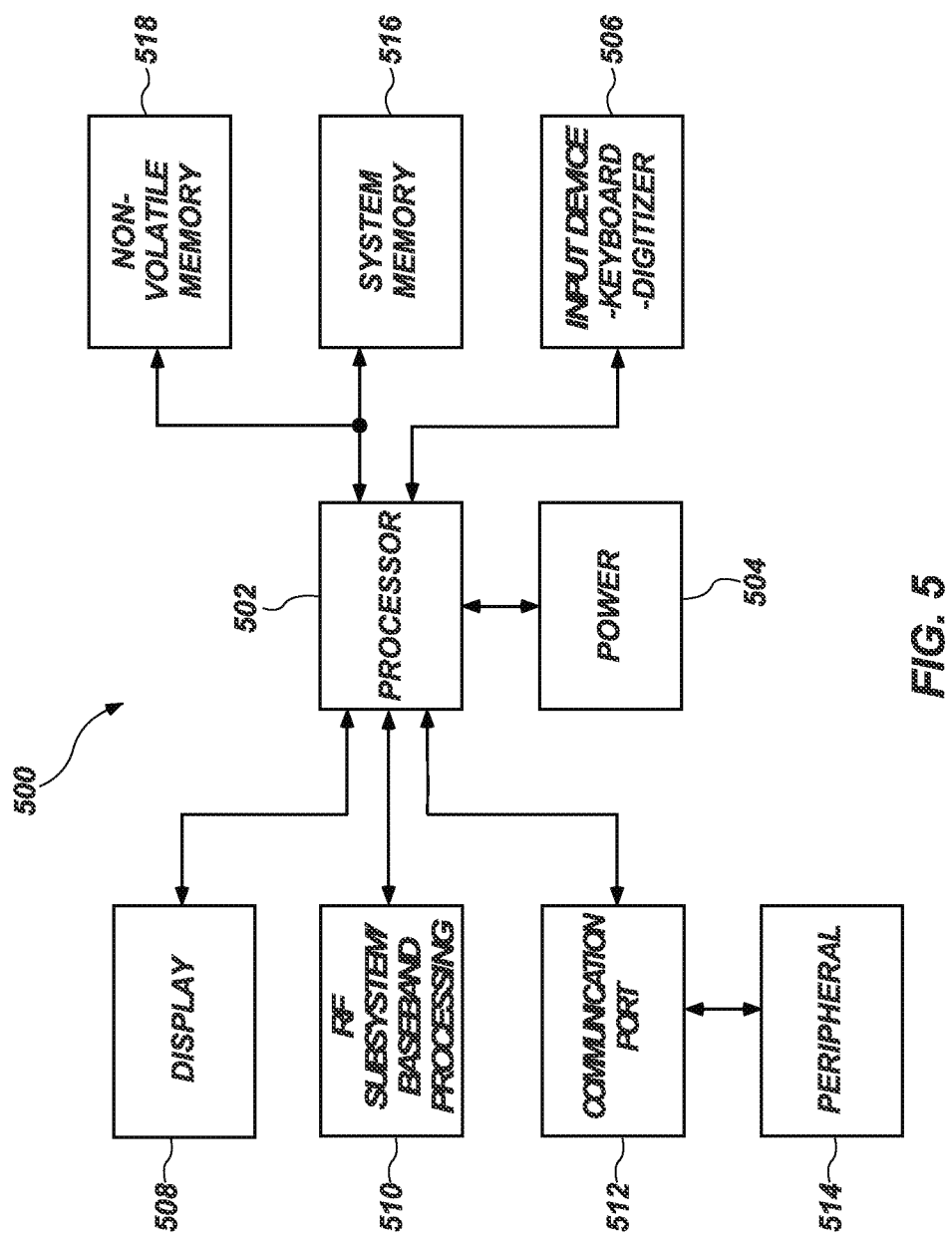
FIG. 5 is a processor-based system, in accordance with embodiments of the disclosure.

With reference to FIG. 5, depicted is a processor-based system 500. The processor-based system 500 may include various microelectronic devices (e.g., microelectronic devices including one or more of the microelectronic device structures 100, 200, 300) manufactured in accordance with embodiments of the present disclosure. The processor-based system 500 may be any of a variety of types such as a computer, pager, cellular phone, personal organizer, control circuit, or other electronic device. The processor-based system 500 may include one or more processors 502, such as a microprocessor, to control the processing of system functions and requests in the processor-based system 500. The processor 502 and other subcomponents of the processor-based system 500 may include microelectronic devices (e.g., microelectronic devices including one or more of the microelectronic device structures 100, 200, 300) manufactured in accordance with embodiments of the present disclosure.

The processor-based system 500 may include a power supply 504 in operable communication with the processor 502. For example, if the processor-based system 500 is a portable system, the power supply 504 may include one or more of a fuel cell, a power scavenging device, permanent batteries, replaceable batteries, and rechargeable batteries. The power supply 504 may also include an AC adapter; therefore, the processor-based system 500 may be plugged into a wall outlet, for example. The power supply 504 may also include a DC adapter such that the processor-based system 500 may be plugged into a vehicle cigarette lighter or a vehicle power port, for example.

Various other devices may be coupled to the processor 502 depending on the functions that the processor-based system 500 performs. For example, a user interface 506 may be coupled to the processor 502. The user interface 506 may include input devices such as buttons, switches, a keyboard, a light pen, a mouse, a digitizer and stylus, a touch screen, a voice recognition system, a microphone, or a combination thereof. A display 508 may also be coupled to the processor 502. The display 508 may include an LCD display, an SED display, a CRT display, a DLP display, a plasma display, an OLED display, an LED display, a three-dimensional projection, an audio display, or a combination thereof. Furthermore, an RF sub-system/baseband processor 510 may also be coupled to the processor 502. The RF sub-system/baseband processor 510 may include an antenna that is coupled to an RF receiver and to an RF transmitter (not shown). A communication port 512, or more than one communication port 512, may also be coupled to the processor 502. The communication port 512 may be adapted to be coupled to one or more peripheral devices 514, such as a modem, a printer, a computer, a scanner, or a camera, or to a network, such as a local area network, remote area network, intranet, or the Internet, for example.

The processor 502 may control the processor-based system 500 by implementing software programs stored in the memory. The software programs may include an operating system, database software, drafting software, word processing software, media editing software, or media playing software, for example. The memory is operably coupled to the processor 502 to store and facilitate execution of various programs. For example, the processor 502 may be coupled to system memory 516, which may include one or more of spin torque transfer magnetic random access memory (STT-MRAM), magnetic random access memory (MRAM), dynamic random access memory (DRAM), static random access memory (SRAM), racetrack memory, and other known memory types. The system memory 516 may include volatile memory, non-volatile memory, or a combination thereof. The system memory 516 is typically large so that it can store dynamically loaded applications and data. In some embodiments, the system memory 516 may include semiconductor devices, such as the microelectronic devices (e.g., the microelectronic device structures 100, 200, 300) described above, or a combination thereof.

The processor 502 may also be coupled to non-volatile memory 518, which is not to suggest that system memory 516 is necessarily volatile. The non-volatile memory 518 may include one or more of STT-MRAM, MRAM, read-only memory (ROM) such as an EPROM, resistive read-only memory (RROM), and flash memory to be used in conjunction with the system memory 516. The size of the non-volatile memory 518 is typically selected to be just large enough to store any necessary operating system, application programs, and fixed data. Additionally, the non-volatile memory 518 may include a high-capacity memory such as disk drive memory, such as a hybrid-drive including resistive memory or other types of non-volatile solid-state memory, for example. The non-volatile memory 518 may include microelectronic devices, such as the microelectronic devices (e.g., the microelectronic device structures 100, 200, 300) described above, or a combination thereof.

Accordingly, in some embodiments, an electronic device comprises an input device, an output device, and a processor device operably coupled to the input device and the output device, and a memory device operably coupled to the processor device. The memory device comprises a stair step region comprising stair step structures including steps comprising horizontal ends of a stack structure comprising vertically alternating conductive structures and insulative structures, and conductive pad structures electrically connecting electrically conductive contact structures to the conductive structures at the steps of at least some of the stair step structures, a lowermost stair step structure of the stair step region not including the conductive pad structures.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A method of forming a microelectronic device, the method comprising:

forming isolated nitride structures on steps of stair step structures formed in a stack structure comprising a vertically alternating arrangement of first insulative materials and second insulative materials arranged in tiers;

forming a photoresist material over a lowermost stair step structure of the stair step structures prior to forming the isolated nitride structures on the steps of the stair step structures; and replacing the isolated nitride structures and the second insulative materials with an electrically conductive material to respectively form conductive pad structures and electrically conductive structures.

2. The method of claim 1, wherein forming isolated nitride structures on steps of stair step structures comprises forming the isolated nitride structures over portions of the second insulative materials.

3. The method of claim 1, further comprising forming conductive contact structures in electrical communication with the conductive pad structures and the electrically conductive structures.

4. The method of claim 1, wherein replacing the isolated nitride structures and the second insulative materials with an electrically conductive material to respectively form conductive pad structures and electrically conductive structures comprises forming conductive pad structures at the steps of about one half of the stair step structures.

5. The method of claim 1, wherein forming isolated nitride structures comprises:

forming a nitride material on the steps of the stair step structures;

exposing the nitride material to a plasma; and exposing the nitride material to an etchant to remove vertically extending portions of the nitride material and form the isolated nitride structures.

6. A method of forming a microelectronic device, the method comprising:

forming a stack structure comprising a vertically alternating arrangement of insulative materials and additional insulative materials arranged in tiers;

forming a lowermost stair step structure in the stack structure;

forming a photoresist material over the lowermost stair step structure;

forming other stair step structures in the stack structure after forming the photoresist material;

forming nitride structures on steps of the other stair step structures;

exposing the nitride structures to a plasma;

removing portions of the nitride structures to form isolated nitride structures;

replacing the isolated nitride structures and the additional insulative materials with an electrically conductive material to respectively form conductive pad structures and electrically conductive structures.

7. The method of claim 6, wherein forming nitride structures comprises forming the nitride structures to have a thickness in a vertical direction within a range of from about 5 nm to about 50 nm.

8. The method of claim 6, wherein forming isolated nitride structures on steps of a stair step structure comprises forming the isolated nitride structures on the additional insulative materials of the stair step structure.

9. A method of forming a microelectronic device, the method comprising:

forming a stack structure comprising a vertically alternating arrangement of first insulative materials and second insulative materials arranged in tiers;

forming a slot structure comprising a dielectric material extending through the stack structure to form a first sub-block and a second sub-block;

forming stair step structures in the stack structure after forming the slot structure;

forming isolated nitride structures on steps of the stair step structures;

forming a photoresist material over some of the stair step structures; and replacing the isolated nitride structures and the second insulative material with an electrically conductive material to respectively form conductive pad structures and electrically conductive structures.

10. The method of claim 9, wherein forming the stair step structures comprises forming the stair step structures in each of the first sub-block and the second sub-block.

11. The method of claim 9, wherein forming isolated nitride structures comprises exposing nitride structures to a plasma to densify horizontally extending portions of the nitride structures.

12. The method of claim 11, further comprising selectively removing less dense portions of the nitride structures relative to more dense portions of the nitride structures to form the isolated nitride structures.

* * * * *

UNITED STATES PATENT AND TRADEMARK OFFICE
CERTIFICATE OF CORRECTION

PATENT NO. : 11,903,211 B2
APPLICATION NO. : 17/647238
DATED : February 13, 2024
INVENTOR(S) : Lifang Xu et al.

It is certified that error appears in the above-identified patent and that said Letters Patent is hereby corrected as shown below:

In the Specification

Column 4, Line 15, change "(Jr), iridium oxide" to --(Ir), iridium oxide--
Column 5, Line 49, change "aluminum oxide ($AL_2O_3$), or a" to --aluminum oxide ($Al_2O_3$), or a--

Signed and Sealed this
Thirtieth Day of April, 2024

Katherine Kelly Vidal
*Director of the United States Patent and Trademark Office*